(12) United States Patent
Sarayama et al.

(10) Patent No.: US 7,462,238 B2
(45) Date of Patent: Dec. 9, 2008

(54) CRYSTAL GROWTH APPARATUS AND METHOD OF PRODUCING A CRYSTAL

(75) Inventors: Seiji Sarayama, Miyagi (JP); Hirokazu Iwata, Miyagi (JP); Akihiro Fuse, Miyagi (JP); Kuniaki Ara, Ibaraki (JP); Junichi Saito, Ibaraki (JP)

(73) Assignees: Ricoh Company, Ltd., Tokyo (JP); Japan Atomic Energy Agency, Higashiibaraki-gun (JP)

( * ) Notice: Subject to any disclaimer, the term of this patent is extended or adjusted under 35 U.S.C. 154(b) by 70 days.

(21) Appl. No.: 11/498,841

(22) Filed: Aug. 4, 2006

(65) Prior Publication Data

US 2007/0034143 A1    Feb. 15, 2007

(30) Foreign Application Priority Data

Aug. 10, 2005    (JP)    ............................... 2005-231762

(51) Int. Cl.
    C30B 25/14    (2006.01)
(52) U.S. Cl. .............................. 117/74; 117/73; 117/81; 117/200; 117/206; 117/900
(58) Field of Classification Search ................. 117/200, 117/206, 900, 73, 74, 81
    See application file for complete search history.

(56) References Cited

U.S. PATENT DOCUMENTS 5,868,837 A    2/1999    DiSalvo et al.
6,949,140 B2    9/2005    Sarayama et al.
7,001,457 B2    2/2006    Sarayama et al.
2004/0134413 A1    7/2004    Iwata et al.
2004/0226503 A1    11/2004    Iwata et al.
2006/0130739 A1    6/2006    Sarayama et al.

FOREIGN PATENT DOCUMENTS

| JP | 2000-12900 | 1/2000 |
| JP | 2001-58900 | 3/2001 |
| JP | 2002-128586 | 5/2002 |
| JP | 2003-238296 | 8/2003 |
| JP | 2003-313098 | 11/2003 |
| JP | 3631724 | 12/2004 |

OTHER PUBLICATIONS

U.S. Appl. No. 11/546,989, filed Oct. 13, 2006, Sarayama et al.
U.S. Appl. No. 11/498,841, Aug. 4, 2006, Sarayama et al.
U.S. Appl. No. 11/684,724, filed Mar. 12, 2007, Iwata et al.
U.S. Appl. No. 11/498,841, filed Aug. 4, 2006, Sarayama et al.

*Primary Examiner*—Felisa C Hiteshew
(74) *Attorney, Agent, or Firm*—Oblon, Spivak, McClelland, Maier & Neustadt, P.C.

(57) ABSTRACT

A crystal growth apparatus comprises a reaction vessel holding a melt mixture containing an alkali metal and a group III metal in a vessel space thereof, a porous member holding a metal melt by a surface tension thereof in a path through which a vapor of the alkali metal in contact with the metal mixture in the vessel space escapes to an external space, the porous member further supplying a nitrogen source gas fed from outside thereto further to the reaction vessel therethrough and through the metal melt by a pressure difference formed between the vessel space in the reaction vessel and the external space, and a heating apparatus heating the melt mixture to a crystal growth temperature.

22 Claims, 16 Drawing Sheets

CRYSTAL GROWTH APPARATUS AND METHOD OF PRODUCING A CRYSTAL

BACKGROUND OF THE INVENTION

The present invention generally relates to production of nitride crystals and more particularly to a crystal growth apparatus used to grow a crystal of group III nitride and a method of producing such a group III nitride crystal.

These days, most of the InGaAlN (a group III nitride semiconductor) devices used for ultraviolet, purple, blue and green optical sources are formed on a substrate of sapphire or silicon carbide (SiC) by conducting thereon an MOCVD process (metal-organic chemical vapor deposition process) or MBE process (molecular beam epitaxy process).

In the case a sapphire or silicon carbide is used for the substrate, however, there are formed a large number of crystal defects in the group III nitride semiconductor layers grown thereon in view of the fact that there exists a large difference in the thermal expansion coefficient and lattice constant between the substrate and the group III nitride semiconductor layers, and because of such crystal defects, there is caused degradation in the device performance. In the case of a light-emitting device, for example, problems such as short lifetime, large operational power consumption, and the like, are caused as a direct consequence of such crystal defects existing with high density.

Further, because a sapphire substrate is an insulator, it is impossible to provide an electrode directly on the substrate contrary to conventional light-emitting devices constructed on a semiconductor substrate. This means that it is necessary to provide an electrode on one of the group III nitride semiconductor layers, while such a construction necessitates large device area for formation of the electrode and the cost of the device is increased inevitably. In addition, there is caused a problem of warp of the substrate because of the use of different materials such as sapphire substrate in combination with the group III nitride semiconductor layers. This problem of warp becomes a serious problem particularly when the device area is increased.

Further, with the group III nitride semiconductor device constructed on a sapphire substrate, chip separation by way of cleaving process is difficult, and it is not easy to obtain an optical cavity edge surface, which is required in laser diodes (LD). Because of this, it has been practiced in the art, when to form an optical cavity edge surface, to conduct a separation process similar to a cleaving process after reducing the thickness of the sapphire substrate to 100 µm or less by conducting a dry etching process or polishing process.

Thus, it has been difficult to conduct formation of optical cavity edge surface and chip separation of with a single step, contrary to the production process of conventional laser diodes, and there has been a problem of increased cost because of the complexity of the fabrication process of light-emitting devices.

In order to solve these problems, there has been made a proposal of reducing the crystal defects by conducting selective growth process of the group III nitride semiconductor layers on the sapphire substrate in a lateral direction. With this approach, it has become possible to reduce the crystal defects successfully, while there still remain problems of insulating nature of the sapphire substrate and difficulty of cleaving a sapphire substrate with such a construction.

In order to solve these problems, use of a gallium nitride (GaN) substrate of generally the same composition to the crystalline materials grown thereon is preferable. Thus, various attempts have been made for growing a bulk GaN crystal by vapor phase growth process or melt growth process. However, GaN substrate of high quality and practical size is not yet realized.

As one approach of realizing a GaN bulk crystal substrate, there is proposed a GaN crystal growth process that uses sodium (Na) for the flux (Patent Reference 1). According to this method, sodium azide ($NaN_3$) and metal Ga are confined in a reaction vessel of stainless steel (vessel dimension: inner diameter=7.5 mm; length=100 mm) as the source material, together with a nitrogen gas, and a GaN crystal is grown by holding the reaction vessel at a temperature of 600-800° C. for 24-100 hours.

According to this method, it becomes possible to carry out the crystal growth at relatively low temperatures of 600-800° C. while maintaining the pressure inside the vessel to a relatively low pressure of 100 $kg/cm^2$ or less. This means that crystal growth can be conducted under a practical condition.

Further, there is realized a high quality group III nitride crystal by causing a reaction between a group V source material including nitrogen and a melt mixture of an alkali metal and a group III metal (Patent Reference 2).

Patent Reference 1
U.S. Pat. No. 5,868,837
Patent Reference 2
Japanese Laid Open Patent Application 2001-58900

SUMMARY OF THE INVENTION

However, with such a growth method that causes growth of a GaN crystal by causing to react the melt mixture of alkali metal and group III metal with the group V source material including nitrogen, there arises a problem in that the alkali metal escapes from the melt mixture to outside of the system during the crystal growth process by causing evaporation, while such escape of the alkali metal induces variation of mole ratio between the alkali metal and the group III metal. As a result, there arise problems in that further increase of crystal size is retarded and the crystals thus obtained tend to include herein fluctuation of crystal quality.

The present invention has been made to solve these problems and it is the object of the present invention to provide a crystal growth apparatus for growing a group III nitride crystal while suppressing evaporation of the alkali metal to outside of the system.

Another object of the present invention is to provide a process for manufacturing a group III nitride crystal while suppressing evaporation of the alkali metal to outside of the system.

According to the present invention, the crystal growth apparatus comprises a reaction vessel, a porous member, and a heating apparatus, wherein the reaction vessel holds a melt mixture containing therein an alkali metal and a group III metal, while the porous member holds, by the action of surface tension, a metal melt on a path through which a vapor of the alkali metal making contact with the melt mixture in the reaction vessel flows out from a vessel space to an external space. Further, the porous member is used to supply a nitrogen source gas supplied from outside to the reaction vessel through the metal melt by a differential pressure between the vessel space and the external space. The heating apparatus is used to heat the melt mixture to a crystal growth temperature.

In a preferred embodiment, the metal melt is different from the melt mixture.

In a preferred embodiment, the metal melt comprises an alkali metal melt.

In a preferred embodiment, the crystal growth apparatus further includes an external reaction vessel that surrounds the reaction vessel and the porous member holds the metal melt between the external reaction vessel and the reaction vessel.

In a preferred embodiment, the temperature of the porous member is set so that there is caused no substantial evaporation in the metal melt.

In a preferred embodiment, the crystal growth apparatus further includes a conduit connected to the external reaction vessel at a lower part of the reaction vessel in terms of gravity direction. Thereby, the porous member is disposed in the conduit at a part lower than the connection part of the conduit to the external reaction vessel.

In a preferred embodiment, the crystal growth apparatus further includes a gas supply unit, wherein the gas supply unit supplies the nitrogen source gas to the porous member form the external space.

In a preferred embodiment, a first temperature at a first interface formed between the space of the external reaction vessel communicating with the vessel space and the metal melt, or in the vicinity of the first interface, is equal to or higher than a second temperature at a second interface formed between the vessel space and the melt mixture or in the vicinity of the second interface.

In a preferred embodiment, a first temperature at a first interface formed between the space of the external reaction vessel communicating with the vessel space and the metal melt, or in the vicinity of the first interface, is generally coincident to a second temperature at a second interface formed between the vessel space and the melt mixture or in the vicinity of the second interface.

In a preferred embodiment, the metal melt is identical to the melt mixture.

In a preferred embodiment, the porous member is provided in contact with the melt mixture.

In a preferred embodiment, the reaction vessel is formed of a first vessel formed of a porous member and holding the melt mixture and a second vessel provided in contact with the first vessel and preventing passage of the melt mixture and a gas.

In a preferred embodiment, the crystal growth apparatus further includes an external reaction vessel and a gas supply apparatus, so that the external reaction vessel surrounds the reaction vessel and so that the gas supply apparatus supplies the nitrogen source gas between the reaction vessel and the external reaction vessel so that the pressure between the reaction vessel and the external reaction vessel is generally coincident to the pressure of the vessel space.

In a preferred embodiment, the porous member is formed of a sintered material of metal or ceramic.

In a preferred embodiment, the porous member is formed of a bunch of metal wires.

Further, according to the present invention, there is provided a manufacturing method of a group III metal nitride crystal by using a crystal growth apparatus, the crystal growth apparatus comprising: a reaction vessel holding a melt mixture containing therein an alkali metal and a group III metal; and a porous member provided on a path through which a vapor of the alkali metal making contact with the melt mixture in the reaction vessel flows out from a vessel space to an external space, the porous member holding, by the action of surface tension, a metal melt and further supplying a nitrogen source gas supplied from outside to the reaction vessel through the metal melt by a differential pressure between the vessel space and the external space.

The manufacturing process of the present invention comprises: a first step of introducing the alkali metal and the group III metal into the reaction vessel in an inert gas ambient or nitrogen gas ambient; a second step of filling the nitrogen source gas in the vessel space; a third step of heating the reaction vessel to a crystal growth temperature; a fourth step of holding a temperature of the reaction vessel at the crystal growth temperature over a predetermined time; and a fifth step of supplying the nitrogen source gas to the reaction vessel through the porous member so that the pressure of the vessel space is held at a predetermined pressure.

In a preferred embodiment, the metal melt is identical to the melt mixture.

In a preferred embodiment, the crystal growth apparatus further comprises an external reaction vessel that surrounds the reaction vessel, and the metal melt is disposed between the reaction vessel and the external reaction vessel.

Further, the manufacturing process comprises: a sixth step of introducing a metal for the metal melt between the reaction vessel and the external reaction vessel in an inert gas ambient; and a seventh step of heating the part between the reaction vessel and the external reaction vessel to a temperature in which the metal for the metal melt becomes a liquid.

In a preferred embodiment, the manufacturing method further comprises an eighth step of holding the temperature of the porous member to a temperature in which there is caused no substantial evaporation in the metal melt through the porous member.

In a preferred embodiment, the crystal growth apparatus further includes an external reaction vessel surroundings the reaction vessel, and the metal melt is disposed between the reaction vessel and the external reaction vessel.

Further, the manufacturing process includes the sixth step of holding the temperature of the porous member to a temperature where there is caused no substantial evaporation in the metal melt through the porous member.

In a preferred embodiment, the metal melt is different from the melt mixture.

In a preferred embodiment, the metal melt is an alkali metal melt.

According to the present invention, evaporation of the alkali metal from the melt mixture of the alkali metal and the group III metal is suppressed as a result of the use of the porous member and the metal melt. Further, the nitrogen source gas is supplied stably to the vessel space contacting with the melt mixture. As a result, the mole ratio of the alkali metal and the group III metal in the melt mixture is stabilized.

Thus, according to the present invention, it becomes possible to manufacture a high quality, large size group III nitride crystal.

DETAILED DESCRIPTION OF THE INVENTION

Figure 1:
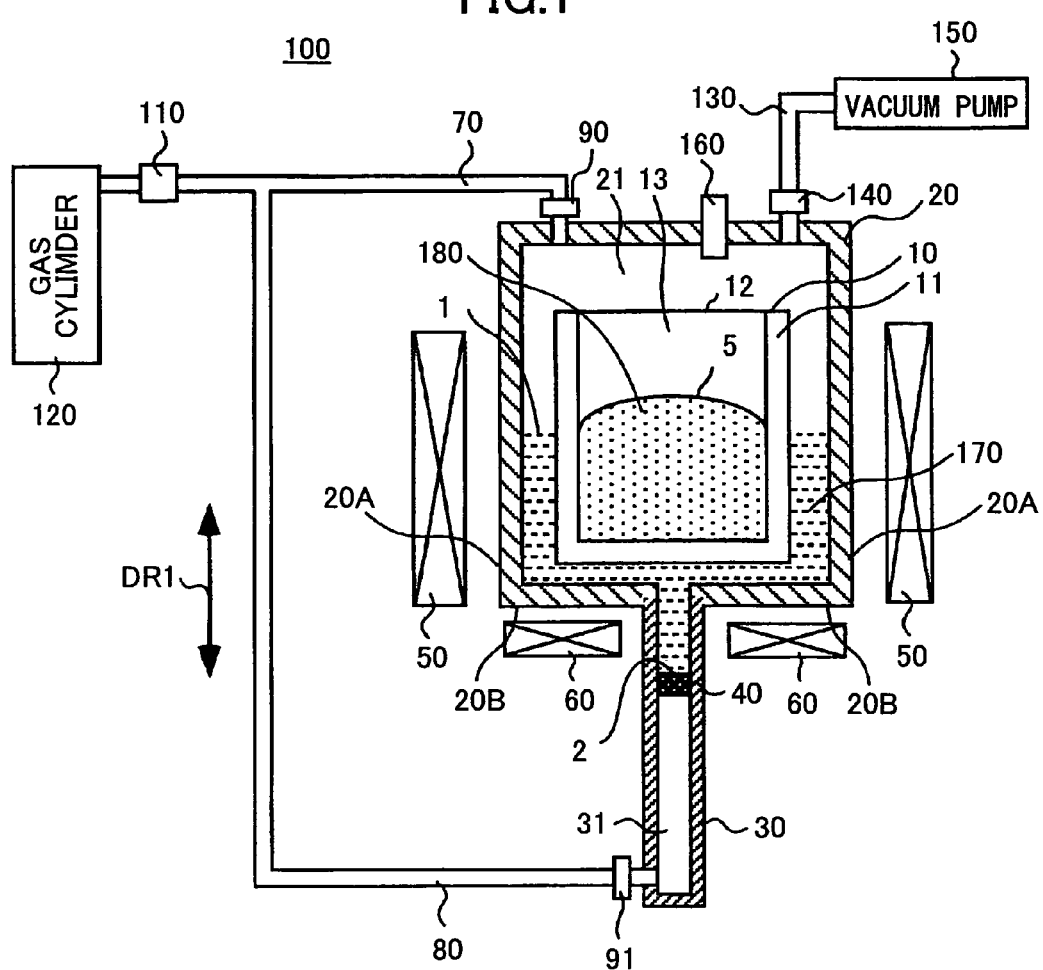
FIG. 1 is a schematic cross-sectional diagram of a crystal growth apparatus according to Embodiment 1 of the present invention.

Hereinafter, the present invention will be explained in detail for the embodiments by referring to the drawings, wherein identical parts or corresponding parts in the drawings are designated by the same reference numerals and repetition of description will be omitted.

EMBODIMENT 1

FIG. 1 is a schematic cross-sectional diagram of a crystal growth apparatus 100 according to Embodiment 1 of the present invention.

Referring to FIG. 1, the crystal growth apparatus 100 of Embodiment 1 of the present invention is comprised of a reaction vessel 10, an external reaction vessel 20, a conduit 30, a porous plug 40, heating apparatuses 50 and 60, gas supply lines 70 and 80, valves 90, 91 and 140, a pressure regulator 110, a gas cylinder 120, an evacuation conduit 130, a vacuum pump 150, a pressure sensor 160, and a metal melt 170.

The reaction vessel 10 has a generally cylindrical form and includes a main part 11 and a lid part 12, wherein the external reaction vessel 20 is disposed so as to surround the reaction vessel 10 with a predetermined separation therefrom. The reaction vessel 10 is formed of boron nitride (BN) while the external reaction vessel 20 is formed of a stainless steel (SUS 316L).

The conduit 30 is connected to the external reaction vessel 20 at the bottom part of reaction vessel 10 in terms of the gravity direction DR1, and the porous plug 40, formed of sintered tungsten (W), for example, is held in the conduit 30 at the part lower than the connection part of the external reaction vessel 20 and the conduit 30. There, the porous plug 40 is formed by sintering powder of tungsten in a hydrogen gas ambient at the temperature of 1600° C.

The heating apparatus 50 is disposed so as to surround the circumferential surface 20A of the external reaction vessel 20. On the other hand, the heating apparatus 60 is disposed so as to face to a bottom surface 20B of the external reaction vessel 20. Further, a first end of the gas supply line 70 is connected to the external reaction vessel 20 via a valve 90, while a second end of the gas supply line 70 is connected to a gas cylinder 120 via the pressure regulator 110. Further, a first end of the gas supply line 80 is connected to the conduit 30 via a valve 91 and a second end of the gas supply line 80 is connected to the gas supply line 70.

Here, it should be noted that the valve 90 is provided to the gas supply line 70 in the vicinity of the external reaction vessel 20, while the valve 91 is provided to the gas supply line 80 in the vicinity of conduit 30. The pressure regulator 110 is provided to the gas supply line 70 in the vicinity of the gas cylinder 120, while the gas cylinder 120 is connected to the gas supply line 70.

The evacuation conduit 130 has an end connected to the external reaction vessel 20 via a valve 140 and another end connected to the vacuum pump 150. The valve 140 is provided to the evacuation conduit 130 in the vicinity of the external reaction vessel 20, and the vacuum pump 150 is connected to the evacuation conduit 130.

A pressure sensor 160 is provided to the external reaction vessel 20, and the metal melt 170 of metallic sodium (metallic Na) melt is held between the reaction vessel 10 and the external reaction vessel 20.

The reaction vessel 10 holds therein a melt mixture 180 of metal Na and metal gallium (Ga), while the external reaction vessel 20 surrounds the reaction vessel 10. Further, the conduit 30 supplies the nitrogen gas ($N_2$ gas) from the gas cylinder 120 to the porous plug 40 through the gas supply lines 70 and 80.

The porous plug 40 has a structure in which pores of several ten microns are connected with each other spatially and provides the function of passing the nitrogen gas inside the conduit 30 toward the metal melt 170. Thereby, the nitrogen gas is supplied to a space 21 through the metal melt 170.

Thereby, it should be noted that, because of the surface tension of the metal melt 170, the metal melt 170 does not invade into the pores of the size of several ten microns, and thus, the metal melt 170 is held on the surface of porous plug 40. Thereby, the metal melt 170 is held between the reaction vessel 10 and the external reaction vessel 20 by the porous plug 40.

The heating apparatus 50 heats the reaction vessel 10 and the external reaction vessel 20 from the circumferential surface 20A of the external reaction vessel 20. On the other hand, the heating apparatus 60 heats the external reaction vessel 20 of the reaction vessel 10 and the external reaction vessel 20 from the bottom surface 20B.

The gas supply line 70 supplies the nitrogen gas supplied from the gas cylinder 120 via the pressure regulator 110, to the external reaction vessel 20 via the valve 90. Further, the gas supply line 80 supplies the nitrogen gas supplied from the gas cylinder 120 via the pressure regulator 110, to the conduit 30 via the valve 91.

The valve 90 functions to supply the nitrogen gas in the gas supply line 70 to the external reaction vessel 20 or to interrupt the supply of the nitrogen gas to the external reaction vessel 20. The valve 91 functions to supply the nitrogen gas in the gas supply line 80 to the conduit 30 or to interrupt the supply of the nitrogen gas to the conduit 30. The pressure regulator 110 supplies the nitrogen gas from the gas cylinder 120 to the gas supply lines 70 and 80 by setting the pressure thereof to a predetermined pressure.

The gas cylinder 120 holds the nitrogen gas as noted previously, while the evacuation conduit 130 passes the gas inside the external reaction vessel 20 to the vacuum pump 150. The valve 140 connects the interior of the external reaction vessel 20 to the evacuation conduit 130 spatially, or disconnects the spatial communication between the external reaction vessel 20 and the evacuation conduit 130. The vacuum pump 150 evacuates the interior of the external reaction vessel 20 through the evacuation conduit 130 and the valve 140.

The pressure sensor 160 detects the pressure inside the external reaction vessel 20. Further, the nitrogen gas is supplied to the space 21 through the metal melt 170 and the porous plug 40.

Figure 2:
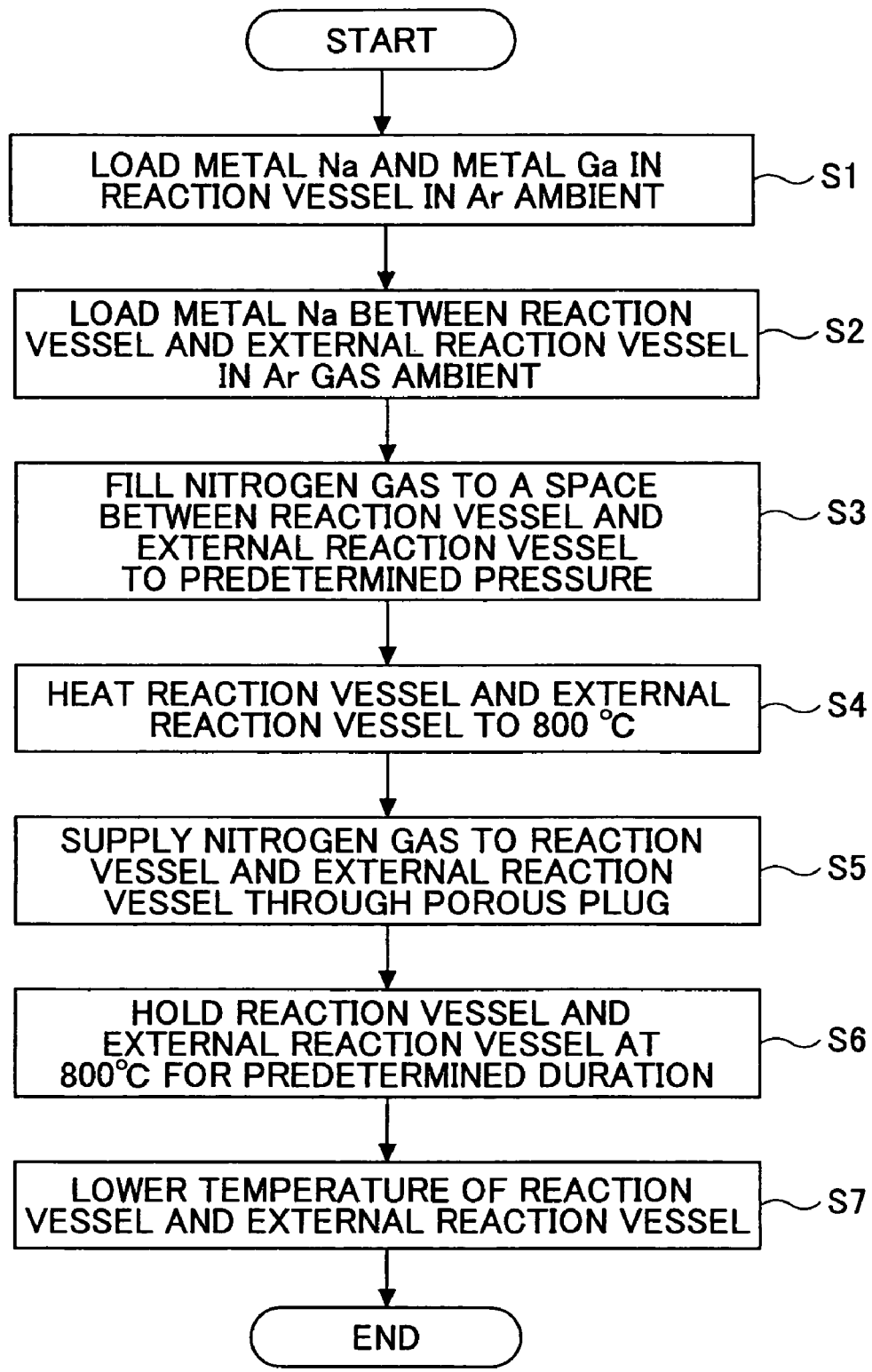
FIG. 2 is a flowchart of the embodiment 1 for explaining the manufacturing process of a GaN crystal.

FIG. 2 is a flowchart of Embodiment 1 for explaining the manufacturing process of the GaN crystal.

Referring to FIG. 2, the reaction vessel 10 and the external reaction vessel 20 are placed in a glove box filled with an Ar gas upon commencement of a series of operation, and metal Na and metal Ga are loaded in the reaction vessel 10 in the Ar gas ambient (Step S1). In this case, the metal Na and the metal Ga are loaded in the reaction vessel 10 with a mole ratio of 5:5. For the Ar gas, an Ar gas containing water with the amount of 10 ppm or less and oxygen with the amount of 10 ppm or less is used. This applies throughout the specification of the present invention.

Thereafter, metal Na is loaded between the reaction vessel 10 and the external reaction vessel 20 in the Ar gas ambient (Step S2). Further, the reaction vessel 10 and the external reaction vessel 20 are mounted upon the crystal growth apparatus 100 in the state that the Ar gas fills the reaction vessel 10 and the external reaction vessel 20.

Next, the valve 140 is opened and the Ar gas filling the reaction vessel 10 and the external reaction vessel 20 is evacuated by the vacuum pump 150. Further, after evacuating the interior of the reaction vessel 10 and the external reaction vessel 20 to a predetermined pressure (0.133 Pa or less) by the vacuum pump 150, the valve 140 is closed and the valves 90 and 91 are opened. With this, the nitrogen gas of the gas cylinder 120 fills the reaction vessel 10 and the external reaction vessel 20 through the gas supply lines 70 and 80. In this case, the nitrogen gas is supplied to the reaction vessel 10 and the external reaction vessel 20 so that the pressure inside the reaction vessel 10 and the external reaction vessel 20 reaches about 1 atmospheric pressure under control of the pressure regulator 110.

When it is indicated by pressure sensor 160 that the pressure inside the external reaction vessel 20 has become about 1 atmospheric pressure, the valves 90 and 91 are closed and the valve 140 is opened. With this, the nitrogen gas filling the reaction vessel 10 and the external reaction vessel 20 is evacuated by the vacuum pump 150.

In this case, too, the interior of the reaction vessel 10 and the external reaction vessel 20 is evacuated to a predetermined pressure (0.133 Pa or less) by using the vacuum pump 150.

This filling of the nitrogen gas and vacuum evacuation thereof to and from the reaction vessel 10 and the external reaction vessel 20 is repeated several times.

Thereafter, the interior of the reaction vessel 10 and the external reaction vessel 20 is evacuated to a predetermined pressure by the vacuum pump 150 and the valve 140 is closed. Further, the valves 90 and 91 are opened, and the nitrogen gas is filled to the reaction vessel 10 and the external reaction vessel 20 so that the pressure inside the reaction vessel 10 and the external reaction vessel 20 falls in the range of 10-50 atmospheric pressure under control of the pressure regulator 110 (Step S3).

Because the metal Na between the reaction vessel 10 and the external reaction vessel 20 takes a solid state in this case, the nitrogen gas is supplied from the space 31 of the conduit 30 to the space 21 of the external reaction vessel 20 and to the space 13 of the reaction vessel 10 through the porous plug 40. Thereby, it should be noted that the lid part 12 is merely placed upon the main part 11 and there exists a gap between the main part 11 and the lid part 12. Thus, the nitrogen gas supplied to the space 21 also fills the space 13 of the reaction vessel 10 through such a gap. Further, the valve 90 is closed when the pressure of the space 21 detected by the pressure sensor 160 has entered the ranges of 10-50 atmospheric pressure. In this point, the spaces 13, 21 and 31 have reached the pressure of 10-50 atmospheric pressure.

Thereupon, the valve 90 is closed and the reaction vessel 10 and the external reaction vessel 20 are heated to a temperature of 800° C. by using the heating apparatuses 50 and 60 (Step S4). Because the metal Na held between the reaction vessel 10 and the external reaction vessel 20 has the melting point of about 98° C., the metal Na undergoes melting during the process of heating the reaction vessel 10 and the external reaction vessel 20 to 800° C., and the metal melt 170 is formed. With this, there are formed two gas-liquid interfaces 1 and 2. Reference should be made to FIG. 1. There, it should be noted that the gas-liquid interface 1 appears at the interface between the metal melt 170 and the space 21 inside the external reaction vessel 20, while the gas-liquid interface 2 appears at the interface between the metal melt 170 and the porous plug 40.

It should be noted that the temperature of the porous plug 40 is about 150° C. at the moment when the reaction vessel 10 and the external reaction vessel 20 have reached the temperature to 800° C. Thereby, the vapor pressure of the metal melt 170 (=melt of metal Na) at the gas-liquid interface 2 takes the value of $7.6 \times 10^{-9}$ atmospheric pressures, and thus, there is caused little evaporation in the metal melt 170 (=melt of metal Na) through the pores of the porous plug 40. As a result, there is caused little decrease in the metal melt 170 (=melt of metal Na).

Further, even when the temperature of the porous plug 40 has reached the temperature to 300° C. or 400° C., the vapor pressure of the metal melt 170 (=melt of metal Na) merely takes the value of $1.8 \times 10^{-5}$ atmospheric pressures or $4.7 \times 10^{-4}$ atmospheric pressures respectively, and decrease of the metal melt 170 (=melt of metal Na) is negligible with the vapor pressure of this magnitude.

Thus, with the crystal growth apparatus 100, the temperature of the porous plug 40 is set to the temperature at which the metal melt 170 (=melt of metal Na) causes no substantial evaporation.

When the temperature of the reaction vessel 10 and the external reaction vessel 20 has increased to 800° C., both the metal Na and the metal Ga inside the reaction vessel 10 take a liquid state, and the melt mixture 180 is formed by the metal Na and the metal Ga. Further, the nitrogen gas in the space 13 is soluble into the melt mixture 180, and there starts a growth of the GaN crystal from the melt mixture 180.

With progress in the growth of the GaN crystal, the nitrogen gas in the space 13 is consumed, and there is caused a decrease of the nitrogen gas in the space 13. With this, the pressure P1 inside the spaces 13 and 21 becomes lower than pressure P2 of the space 31 inside the conduit 30 (P1<P2), and there appears a differential pressure between the spaces 13 and 21 and the interior of the space 31. Thereby, the nitrogen gas of the space 31 is gradually supplied to the space 21 and also to the space 13 through the porous plug 40 and the metal melt 170 (=melt of metal Na) (step S5).

Thereafter, the temperature of the reaction vessel 10 and the external reaction vessel 20 is held at 800° C. over the period of several ten hours to several hundreds hours (step S6). With this, a GaN crystal of large size is grown. This GaN crystal has a columnar form grown in the c axis direction (<0001>) and is free from defects.

Further, the temperature of the reaction vessel 10 and the external reaction vessel 20 is lowered (step S7), and with this, formation of the GaN crystal is completed.

Figure 3:
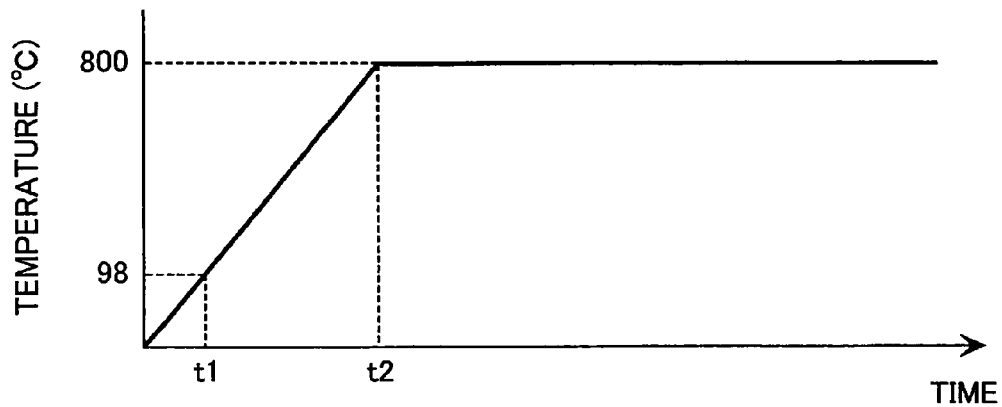
FIG. 3 is a timing chart showing the temperature of the reaction vessel and the external reaction vessel.
Figure 4:
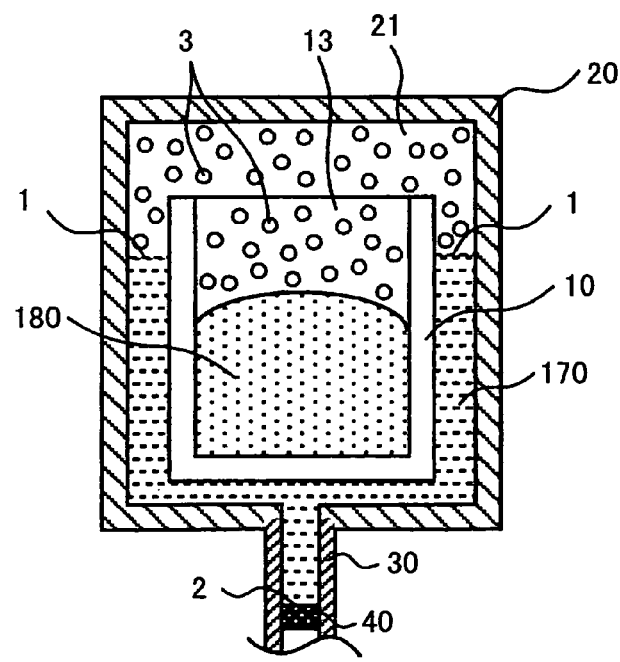
FIG. 4 is a schematic diagram showing the state inside the reaction vessels and the external reaction vessel between the two timings t1 and t2 shown in FIG. 3.
Figure 5:
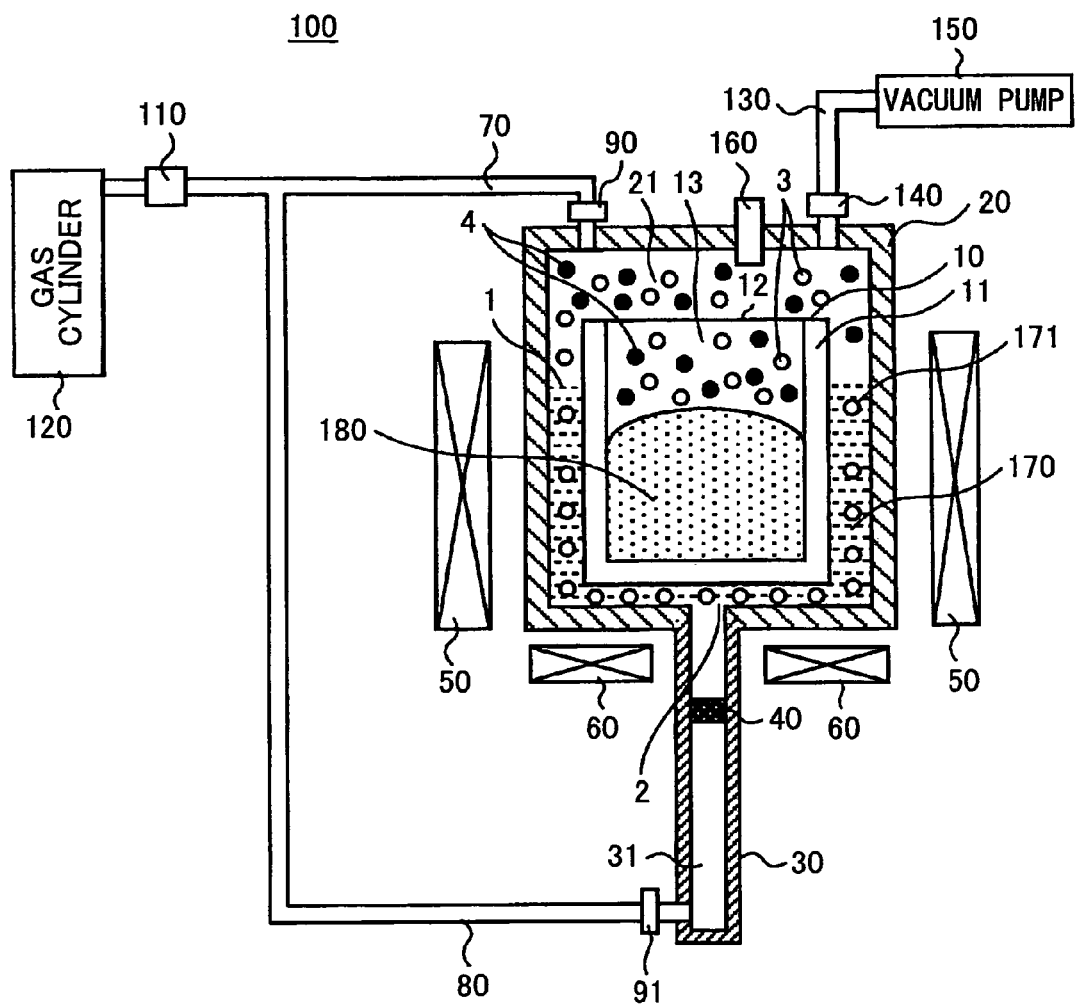
FIG. 5 is a schematic diagram showing the state inside the reaction vessel and the external reaction vessel in the step S5 shown in FIG. 2.

FIG. 3 is a timing chart of the temperature of the reaction vessel 10 and the external reaction vessel 20, while FIG. 4 is a schematic diagram showing the state inside the reaction vessel 10 and the external reaction vessel 20 in the interval between the two timings t1 and t2 shown in FIG. 3. Further, FIG. 5 is a schematic diagram showing the state inside the reaction vessel 10 and the external reaction vessel 20 in the step S5 shown in FIG. 2.

Referring to FIG. 3, the temperature of the reaction vessel 10 and the external reaction vessel 20 start to rise when the reaction vessel 10 and the external reaction vessel 20 are heated by the heating apparatuses 50 and 60, wherein the temperature reaches 98° C. at the timing t1 and 800° C. at the timing t2.

Thereby, the metal Na held between the reaction vessel 10 and the external reaction vessel 20 undergoes melting and the metal melt 170 (=melt of metal Na) is formed. Thereby, the nitrogen gas 3 cannot cause diffusion to the space 31 inside the conduit 30 through the metal melt 170 (=melt of metal Na) and the porous plug 40 but is confined in the spaces 13 and 21 (reference should be made to FIG. 4).

Thus, with the crystal growth apparatus 100, growth of the GaN crystal is conducted by confining the nitrogen gas 3 in the spaces 13 and 21 inside the reaction vessel 10 and the external reaction vessel 20 by the porous plug 40 and the metal melt 170 (=melt of metal Na).

After the timing t2, the temperature of the reaction vessel 10 and the external reaction vessel 20 is held to 800° C., and growth of the GaN crystal proceeds in the melt mixture 180. After the timing t1, there starts evaporation of metal Na in the metal melt 170 and the melt mixture 180 with gradually increasing vapor pressure. After the timing t2, Na has the vapor pressure of 0.45 atmospheric pressures at 800° C. As a result, there exist the nitrogen gas 3 and the metal Na vapor 4 in the spaces 13 and 21.

Further, there is caused a decrease in the pressure P1 of the spaces 13 and 21 with regard to the pressure P2 of the space 31 inside the conduit 30 as a result of consumption of the nitrogen gas 3. When this occurs, the metal melt 170 moves to the spaces 13 and 21 side, while this leads to elevation of the gas-liquid interfaces 1 and 2 of the metal melt 170.

Under this situation, the nitrogen gas is supplied to the metal melt 170 through the porous plug 40 from the space 31 of the conduit 30, wherein the nitrogen gas is transported through the metal melt 170 in the form of bubbles 171 and supplied to the spaces 13 and 21 through the gas-liquid interface 1. When the pressure P1 inside the spaces 13 and 21 has become almost same as the pressure P2 inside the space 31, the metal melt 170 descends to an original location, and supply of the nitrogen gas to the reaction vessel 10 and the external reaction vessel 20 from the space 31 of the conduit 30 through the porous plug 40 and the metal melt 170 is stopped.

Thus, through the existence of the porous plug 40, the metal melt 170 is held between the reaction vessel 10 and the external reaction vessel 20 by the surface tension of metal melt 170 (=melt of metal Na) and supply of the nitrogen gas from the space 31 to the reaction vessel 10 and the external reaction vessel 20 is attained. Thus, the porous plug 40 has a structure capable of preventing passage of metal melt 170 therethrough.

Further, with the crystal growth apparatus 100, growth of the GaN crystal is attained in the state that the vapor 4 of the metal Na is confined in the spaces 13 and 21. With this feature, evaporation of metal Na from the melt mixture 180 is decreased, and it becomes possible to maintain the mole ratio between the metal Na and the metal Ga in the melt mixture 180 generally constant. Thereby, growth of large and high quality GaN crystal becomes possible.

Further, with the crystal growth apparatus 100, the heating apparatus 50 heats the reaction vessel 10 and the external reaction vessel 20 so that the temperature T1 at the gas-liquid interface 1 between the metal melt 170 and the space 21 inside the external reaction vessel 20 that communicates with the space 13 inside the reaction vessel 10 or in the vicinity of the gas-liquid interface 1, generally coincides with the temperature T2 at gas-liquid interface 5 between the space 13 and the melt mixture 180 or in the vicinity of the gas-liquid interface 5.

By setting the temperature T1 at the gas-liquid interface 1 or in the vicinity of the gas-liquid interface 1 to be generally equal to the temperature T2 in the gas-liquid interface 5 or in the vicinity of the gas-liquid interface 5 as such, the vapor of the metal Na evaporated from the metal melt 170 causes equilibrium with the vapor of the metal Na evaporated from the melt mixture 180 in the spaces 13 and 21, and it becomes possible to suppress the diffusion of the metal Na vapor inside the space 13 into the space 21. As a result, it becomes possible to stabilize the mole ratio between the metal Na and the metal Ga in the melt mixture 180 by suppressing the evaporation of metal Na from the melt mixture 180. Thereby, a high quality GaN crystal of large size can be manufactured with reliability.

Further, with the crystal growth apparatus 100, it is possible to heat the reaction vessel 10 and the external reaction vessel 20 so that the temperature T1 is higher than the temperature T2. In this case, an additional heating apparatus is provided further between the reaction vessel 10 and the external reaction vessel 20 and the additional heating apparatus is used to heat the reaction vessel 10 so that the temperature of the gas-liquid interface 5 or the region in the vicinity of the gas-liquid interface 5 to T2 and so that the temperature of the gas-liquid interface 1 or the region in the vicinity of the gas-liquid interface 1 to T1.

Thus, by setting the temperature T1 to be higher than the temperature T2 as such, the vapor pressure of the metal Na at the gas-liquid interface 1 becomes higher than the vapor pressure of the metal Na at the gas-liquid interface 5, and there is caused a diffusion of the vapor of the metal Na from the space 21 to the space 13. Thereby, there is caused an increase of concentration of the metal Na vapor in the space 13, and it becomes possible to suppress the evaporation of metal Na from the melt mixture 180 further. As a result, the mole ratio between the metal Na and the metal Ga in the melt mixture 180 is stabilized with reliability, and it becomes possible to produce a high quality GaN crystal of large size with reliability.

Thus, with the crystal growth apparatus 100, production of the GaN crystal is achieved by setting the temperature T1 to be equal to or higher than the temperature T2.

Figure 6:
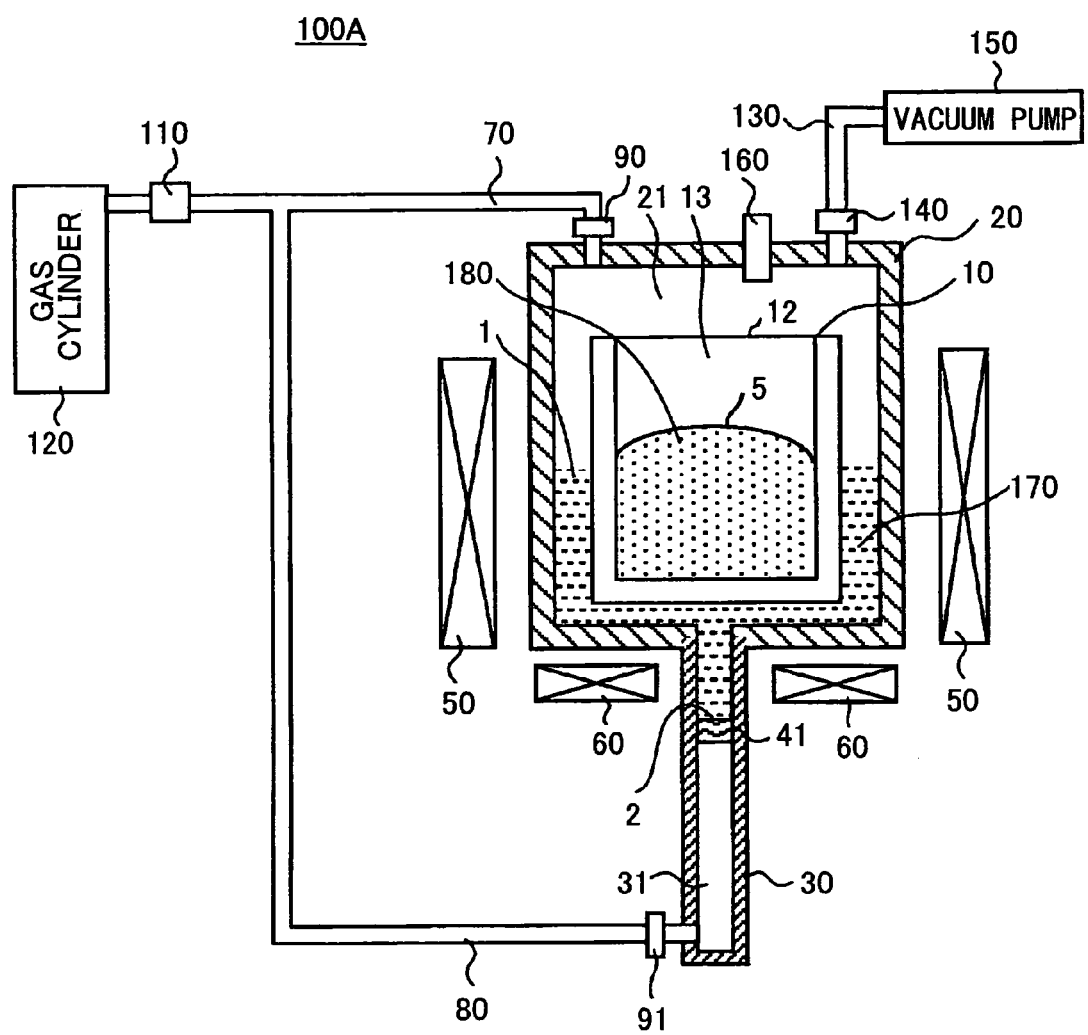
FIG. 6 is another schematic cross-sectional view of the crystal growth apparatus according to Embodiment 1.

FIG. 6 is another schematic cross-sectional diagram of the crystal growth apparatus of Embodiment 1. Here, the crystal growth apparatus of Embodiment 1 may be a crystal growth apparatus 100A shown in FIG. 6.

Referring to FIG. 6, the crystal growth apparatus 100A is the one in which the porous plug 40 of the crystal growth apparatus 100 shown in FIG. 1 is replaced with a porous plug 41. Otherwise, the crystal growth apparatus 100A is identical to the crystal growth apparatus 100.

It should be noted that the porous plug 41 is formed by compressing metal wires to form a body of compressed metal wires (referred to as "bunch of metal wires"). More specifically, the porous plug 41 is produced with compression forming applying on a bunch of wires of SUS 316L of 0.1 mm diameter and 5 m long. The porous plug 41 thus formed includes pores of several hundreds microns.

Thus, by compression forming of the SUS316L wires, it becomes possible to obtain the porous plug 41 with larger pore size over the porous plug 40. Further, it becomes possible to control the size of the pores of the porous plug 41 with the present embodiment by changing the diameter of the SUS316L wires.

Further, by increasing the size of the pores of the porous plug 41 relatively, it becomes possible to eliminate the problem of clogging of the porous plug 41. It should be noted that metal Na easily causes formation of oxide or hydroxide and there is a possibility that the porous plug 41 is clogged with the oxide or hydroxide thus formed. On the other hand, the porous plug 41 includes relatively large pores and is capable of controlling the pore size. Thus, it is possible to eliminate the clogging in the porous plug 41, and as a result, stable crystal growth is realized. Thereby, it becomes possible to produce a high quality GaN crystal of large size and uniform composition.

Manufacturing of GaN crystal in the crystal growth apparatus 100A is executed in accordance with the flowchart shown in FIG. 2 similarly to the manufacturing process of the GaN crystal conducted in the crystal growth apparatus 100. Thus, in the crystal growth apparatus 100A, too, manufacture of the GaN crystal is conducted by heating the reaction vessel 10 and the external reaction vessel 20 so that the temperature T1 is equal to or higher than the temperature T2.

Further, it is also possible to manufacture the porous plug 40 by sintering powders of SUS316L or SUS304 or boron nitride (BN). Further, the produce porous plug 41 may be manufactured by the compression molding of SUS304 wires, INCONEL (trademark) wires, or the like. In the case of manufacturing the porous plug 40 by using SUS (316L and 304), the powders of SUS are sintered at the temperature of 1200° C.

With Embodiment 1, the porous plugs 40 and 41 constitute the "porous member".

Further, the pressure regulator 110 and the gas cylinder 120 constitute "gas supply apparatus".

Further, the space 31 inside the conduit 30 constitutes "external space".

EMBODIMENT 2

Figure 7:
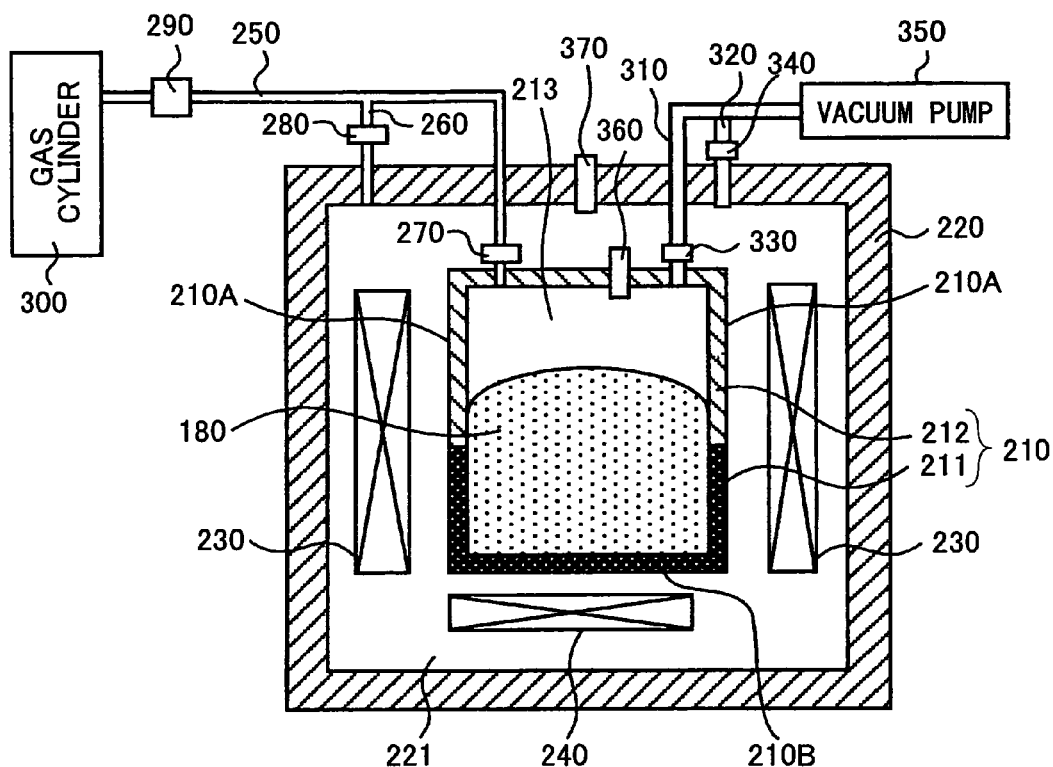
FIG. 7 is a schematic cross-sectional diagram of the crystal growth apparatus according to Embodiment 2.

FIG. 7 is a schematic cross-sectional diagram of a crystal growth apparatus 200 according to Embodiment 2 of the present invention.

Referring to FIG. 7, the crystal growth apparatus 200 of Embodiment 2 is comprised of a reaction vessel 210, an external reaction vessel 220, heating apparatuses 230 and 240, gas supply lines 250 and 260, valves 270, 280, 330 and 340, a pressure regulator 290, a gas cylinder 300, an evacuation lines 310 and 320, a vacuum pump 350, and pressure sensors 360 and 370.

The reaction vessel 210 has a generally cylindrical form and comprised of vessels 211 and 212, wherein the vessel 211 is formed of sintered W, while the vessel 212 is formed of SUS316L. The reaction vessel 211 is connected to the vessel 212 and constitutes the generally cylindrical reaction vessel 210 by being connected with the vessel 212.

The external reaction vessel 220 is disposed so as to surround the reaction vessel 210 with a predetermined separation therefrom. The heating apparatus 230 is disposed between the reaction vessel 210 and the external reaction vessel 220 so as to oppose a circumferential surface 210A of the reaction vessel 210, while the heating apparatus 240 is disposed between the reaction vessel 210 and the external reaction vessel 220 so as to oppose a bottom surface 210B of the reaction vessel 210.

The gas supply line 250 has an end connected to the reaction vessel 210 via the valve 270 and another end connected to the gas cylinder 300 via the pressure regulator 290. The gas supply line 260 has an end connected to the reaction vessel 220 via the valve 280 and another end connected to the gas supply line 250.

The valve 270 is mounted upon the gas supply line 250 in the vicinity of the reaction vessel 210, while the valve 280 is mounted upon the gas supply line 260 in the vicinity of the external reaction vessel 220. Further, the pressure regulator 290 is mounted upon the gas supply line 250 in the vicinity of the gas cylinder 300, and the gas cylinder 300 is connected to the gas supply line 250.

The evacuation conduit 310 has an end connected to the reaction vessel 210 via the valve 330 and the other end connected to the vacuum pump 350. Further, the evacuation conduit 320 has an end connected to the external reaction vessel 220 via the valve 340 and another end connected to the evacuation conduit 310. The valve 330 is mounted upon the evacuation conduit 310 in the vicinity of the reaction vessel 210, while the valve 340 is mounted upon the evacuation conduit 320 in the vicinity of the external reaction vessel 220. The vacuum pump 350 is connected to the evacuation conduit 310.

The pressure sensor 360 is attached to the reaction vessel 210 while the pressure sensor 370 is attached to the external reaction vessel 220.

The reaction vessel 210 holds the melt mixture 180 of metal Na and metal Ga therein. Further, the vessel 211 has a structure in which pores of several ten microns are connected spatially and introduces the nitrogen gas from the space 221 inside the external reaction vessel 220 via the melt mixture 180 to the space 213 inside the reaction vessel 210 and further holds the melt mixture 180 in the reaction vessel 210. It should be noted that, because of surface tension of the melt mixture 180, the melt mixture 180 does not penetrate into the pores of several ten microns. Further, the vessel 212 seals the nitrogen gas and the vapor of the metal Na existing in the space 213 within the space 213.

The external reaction vessel 220 surrounds the reaction vessel 210. Thereby, the heating apparatus 230 heats the reaction vessel 210 from the circumferential surface 210A of the reaction vessel 210, while the heating apparatus 240 heats the reaction vessel 210 from the bottom surface 210B of the reaction vessel 210.

The gas supply line 250 supplies the nitrogen gas supplied from the gas cylinder 300 through the pressure regulator 290 to the reaction vessel 210 inside the valve 270. Further, the gas supply line 260 supplies the nitrogen gas that was supplied from the gas cylinder 300 to through the pressure regulator 290 to the external reaction vessel 220 through the valve 280.

The valve 270 supplies the nitrogen gas in the gas supply line 250 to the reaction vessel 210 and further stops the supply of the nitrogen gas to the reaction vessel 210, while the valve 280 supplies the nitrogen gas in the gas supply line 260 to the external reaction vessel 220 and further stops the supply of the nitrogen gas to the external reaction vessel 220. The pressure regulator 290 supplies the nitrogen gas in the gas cylinder 300 to the gas supply lines 250 and 260 by setting the pressure thereof to a predetermined pressure.

The gas cylinder 300 holds the nitrogen gas and the evacuation conduit 310 passes the gas in the reaction vessel 210 to the vacuum pump 350. The valve 330 connects the interior of the reaction vessel 210 to the evacuation conduit 310 spatially and further disconnects the spatial communication between the reaction vessel 210 and the evacuation conduit 310.

The evacuation conduit 320 passes the gas inside the external reaction vessel 220 to the vacuum pump 350, while the valve 340 connects the interior of the external reaction vessel 220 to the evacuation conduit 320 spatially, or disconnects the spatial communication between the external reaction vessel 220 and the evacuation conduit 320.

The vacuum pump 350 evacuates the interior of the reaction vessel 210 through the evacuation conduit 310 and the valve 330 and evacuates the interior of the external reaction vessel 220 through the evacuation conduit 320 and the valve 340.

The pressure sensor 360 detects the pressure inside the reaction vessel 210 while the pressure sensor 370 detects the pressure inside the external reaction vessel 220.

In the case of growing a GaN crystal by using the crystal growth apparatus 200, metal Na and metal Ga are loaded in the reaction vessel 210 in a glove box of an Ar gas ambient and the reaction vessel 210 and the external reaction vessel 220 are mounted upon the crystal growth apparatus 200 in the state that a space 213 in the reaction vessel 210 and a space 221 the external reaction vessel 220 are filled with the Ar gas.

Further, the valves 330 and 340 are opened and the reaction vessel 210 and the external reaction vessel 220 are evacuated to a predetermined pressure (0.133 Pa or less) by the vacuum pump 350 through the evacuation conduits 310 and 320. Thereafter, the valves 330 and 340 are closed and the valves 270 and 280 are opened, and the reaction vessel 210 and the external reaction vessel 220 are filled with the nitrogen gas from the gas cylinder 300 through the gas supply lines 250 and 260. In this case, The nitrogen gas is supplied to the reaction vessel 210 and the external reaction vessel 220 under control by the pressure regulator 290 so that the pressure inside the reaction vessel 210 and the external reaction vessel 220 becomes about 1 atmospheric pressure.

Thus, when the pressure inside the reaction vessel 210 and the external reaction vessel 220 detected by the pressure sensors 360 and 370 has become about 1 atmospheric pressure, the valves 270 and 280 are closed and valves 330 and 340 are opened, and the nitrogen gas filling the reaction vessel 210 and the external reaction vessel 220 is evacuated by the vacuum pump 350. In this case, too, the reaction vessel 210 and the external reaction vessel 220 are evacuated by the vacuum pump 350 to a predetermined pressure (0.133 Pa or less).

This filling of the nitrogen gas and vacuum evacuation thereof to and from the reaction vessel 210 and the external reaction vessel 220 is repeated several times.

Thereafter, the interior of the reaction vessel 210 and the external reaction vessel 220 is evacuated to a predetermined pressure by the vacuum pump 350 and the valves 330 and 340 are closed. Further, the valves 270 and 280 are opened, and the nitrogen gas is filled to the reaction vessel 210 and the external reaction vessel 220 so that the pressure inside the reaction vessel 210 and the external reaction vessel 220 falls in the range of 10-50 atmospheric pressure under control of the pressure regulator 290.

Further, the valve 270 is closed when the pressure detected by the pressure sensors 360 and 370 has become 10-50 atmospheric pressure. In this point, the reaction vessel 210 and the external reaction vessel 220 are at the room temperature, and thus, the metal Na and the metal Ga inside the reaction vessel 210 take a solid state. Thus, the nitrogen gas filling the external reaction vessel 220 through the valve 280 causes diffusion into the reaction vessel 210 through the pores of the vessel 211, and the pressure inside the reaction vessel 210 is readily set equal to the pressure in the external reaction vessel 220.

Upon completion of filling of the nitrogen gas to the reaction vessel 210 and the external reaction vessel 220, the reaction vessel 210 is heated to 800° C. by the heating apparatuses 230 and 240, wherein the temperature of the reaction vessel 210 is held at 800° C. thereafter for the duration of several ten hours to several hundred hours.

The metal Na and the metal Ga loaded in the reaction vessel 210 undergo melting with this process of heating of the reaction vessel 210, and the melt mixture 180 is formed in the reaction vessel 210. In this state, the nitrogen gas in the space 213 inside the reaction vessel 210 does not make contact with the vessel 211, and thus, the nitrogen gas cannot pass through the vessel 212 nor the melt mixture 180. Thus the nitrogen gas is confined in the space 213.

With progress of growth of the GaN crystal, there is caused evaporation of the metal Na from the melt mixture 180, and thus, the vapor of the metal Na and the nitrogen gas are confined in the space 213. In this case, the pressure of the metal Na vapor in the space 213 takes the value of 0.45 atmospheric pressures.

With progress in the growth of the GaN crystal, the nitrogen gas inside space 213 is consumed, and when the pressure P3 inside the reaction vessel 210 has become lower than the pressure P4 inside the external reaction vessel 220 (P3<P4), the nitrogen gas existing in the space 221 inside the external reaction vessel 220 is introduced into the reaction vessel 210 through the vessel 211.

Figure 8:
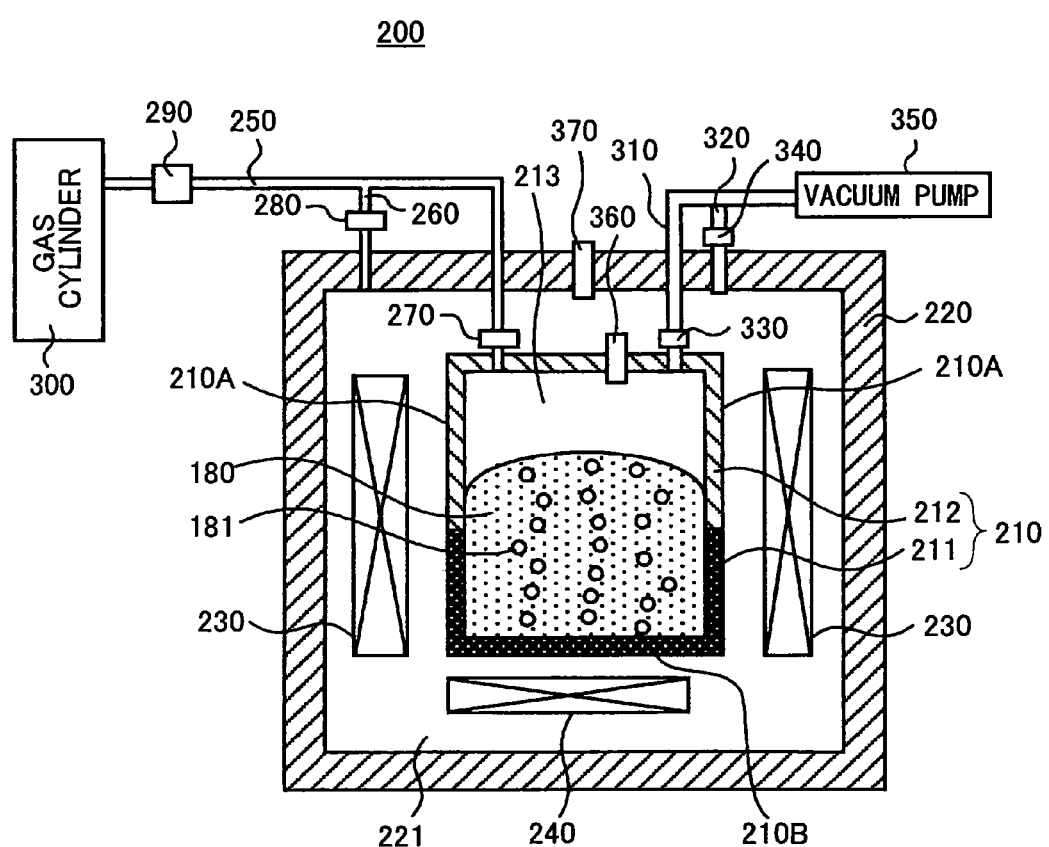
FIG. 8 is a schematic diagram showing a process of growth of a GaN crystal in the crystal growth apparatus shown in FIG. 7.

FIG. 8 is a schematic diagram showing a step in the growth process of the GaN crystal in the crystal growth apparatus 200 shown in FIG. 7.

Referring to FIG. 8, the nitrogen gas introduced into the reaction vessel 210 from the space 221 are transported through the melt mixture 180 in the form of bubbles 181 and introduced into the space 213. With this, the nitrogen gas is supplied stably to the space 213.

At the time of growing the GaN crystal, the temperature of the vessel 211 is 800° C. Thereby, it should be noted that, because the vessel 211 is formed of sintered W as noted before, the melt mixture 180 is held in the reaction vessel 210 by the surface tension of the melt mixture 180, and leakage of the melt mixture 180 from the reaction vessel 210 is prevented.

Thus, by forming the vessel 211 constituting a part of the reaction vessel 210 by the sintered W and holding the melt mixture 180 in the reaction vessel 210 by the surface tension of the melt mixture 180, it becomes possible to confine the nitrogen gas and the vapor of the metal Na in the space 213 in contact with the melt mixture 180.

As a result, it becomes possible to realize a high quality, large size, and homogeneous GaN crystal similarly to the case of the crystal growth apparatus 100 shown in FIG. 1.

Figure 9:
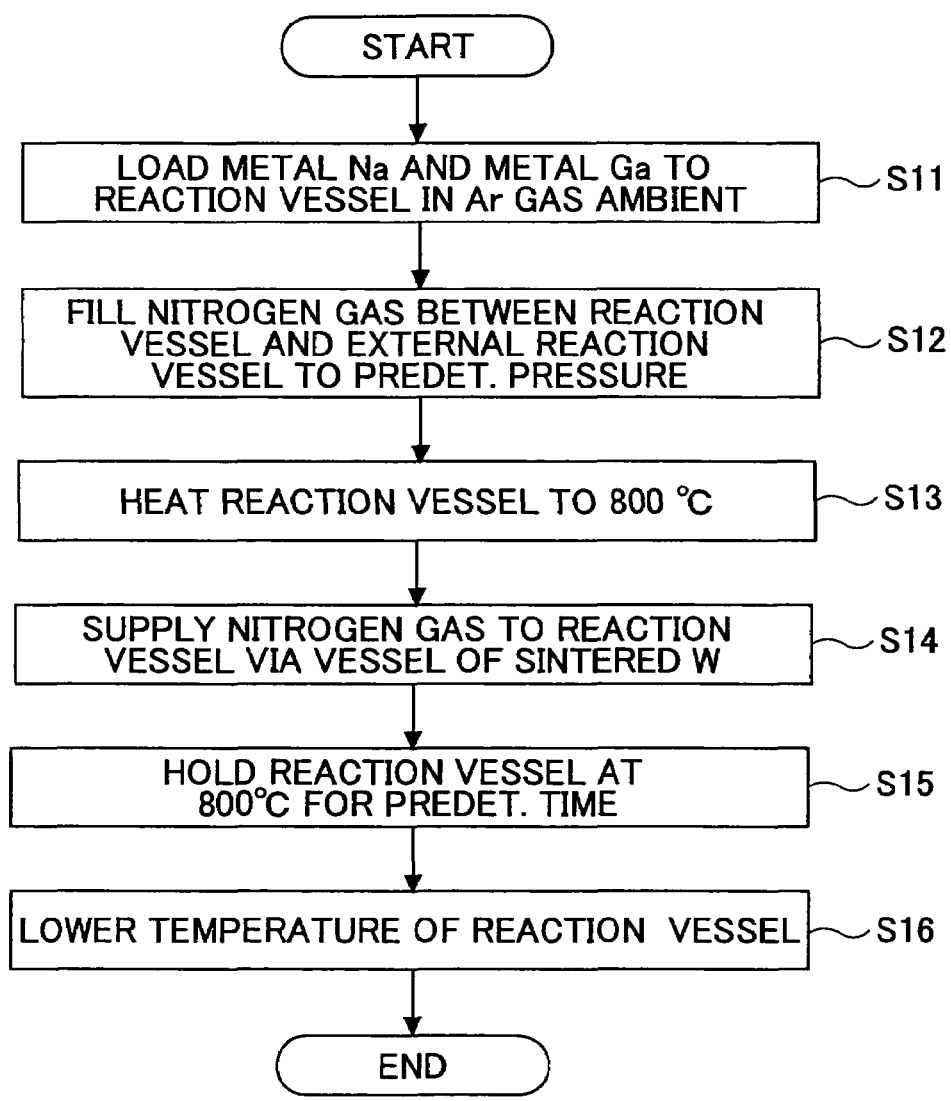
FIG. 9 is a flowchart according to Embodiment 2 explaining the manufacturing process of the GaN crystal.

FIG. 9 is a flowchart explaining the manufacturing process of GaN crystal according to Embodiment 2.

Referring to FIG. 9, the reaction vessel 210 and the external reaction vessel 220 are accommodated in a glove box filled with an Ar gas upon commencement of a series of operation, and metal Na and metal Ga are loaded in the reaction vessel 210 in the Ar gas ambient (Step S11). In this case, the metal Na and the metal Ga are loaded in the reaction vessel 210 with a mole ratio of 5:5.

Next, the reaction vessel 210 and the external reaction vessel 220 are mounted upon the crystal growth apparatus 200 in the state that the Ar gas fills the reaction vessel 210 and the external reaction vessel 220.

Next, the foregoing operation of vacuum evacuation of the reaction vessel 210 and the external reaction vessel 220 and filling of the nitrogen gas to the reaction vessel 210 and the external reaction vessel 220 are conducted several times.

Further, the valves 330 and 340 are opened and the nitrogen gas filling the reaction vessel 210 and the external reaction vessel 220 is evacuated by the vacuum pump 350.

After the reaction vessel 210 and the external reaction vessel 220 are evacuated to a predetermined pressure (0.133 Pa or less) by the vacuum pump 350, the valves 330 and 340 are closed and the valves 270 and 280 are opened, and the nitrogen gas of the gas cylinder 300 is supplied to the reaction vessel 210 and to the external reaction vessel 220 through the gas supply lines 250 and 260. Further, the reaction vessel 210 and the external reaction vessel 220 under control of the pressure regulator 290 so that the pressure inside the reaction vessel 210 and the external reaction vessel 220 falls in the range of 10-50 atmospheric pressures (step S12).

Thereby, because the metal Na and the metal Ga loaded in the reaction vessel 210 take a solid state, it should be noted that the nitrogen gas is supplied to the space 213 inside the reaction vessel 210 from the space 221 of the external reaction vessel 220 also through the vessel 211 of the reaction vessel 210. Further, the valve 270 is closed when the pressure in the spaces 213 and 221 detected by the pressure sensors 360 and 370 has reached the pressure of 10-50 atmospheric pressures.

Thereafter, the reaction vessel 210 is heated to the temperature of 800° C. by the heating apparatuses 230 and 240 (step S13). With this, the metal Na and the metal Ga in the reaction vessel 210 undergo melting, and the melt mixture 180 is formed in the reaction vessel 210. Further, when the temperature of the melt mixture 180 has reached 800° C., there starts the growth of the GaN crystal in the melt mixture 180.

It should be noted that the vessel 211 is heated to the temperature of 800° C. when the reaction vessel 210 has been heated to the temperature of 800° C. Even in such a case, the vessel 211, being formed of sintered W, holds the melt mixture 180 in the reaction vessel 210 by the surface tension of the melt mixture 180.

Further, with progress of growth of the GaN crystal, there is caused evaporation of metal Na from the melt mixture 180, and vapor of metal Na is formed in the space 213. The vapor of metal Na thus formed takes a pressure of about 0.45 atmospheric pressures at the temperature of 800° C. Even when the vapor of metal Na is thus formed in the space 213, it should be noted that the vapor of the metal Na makes contact only to the melt mixture 180 and the vessel 212, and does not cause leakage from the space 213 to the outside of the reaction vessel 210. As a result, the mole ratio between the metal Na and the metal Ga in the melt mixture 180 is stabilized.

With further progress in the growth of the GaN crystal, the nitrogen gas inside the space 213 is consumed, and there is caused decrease of the nitrogen gas in the space 213. Thereby, the pressure P3 inside the space 213 becomes lower than the pressure P4 of the space 221 (P3<P4), and differential pressure appears between the space 213 and the space 221. When this occurs, the nitrogen gas of the space 221 is supplied to the space 213 through the vessel 211 (formed of sintered W) and the melt mixture 180 (step S14).

Thereafter, the temperature of the reaction vessel 210 is held at 800° C. over a predetermined period of several ten hours to several hundreds hours (step S15). With this, a GaN crystal of large size is grown. This GaN crystal has a columnar form grown in the c axis direction (<0001>) and is free from defects.

Further, the temperature of the reaction vessel 210 is lowered (step S16), and with this, formation of the GaN crystal is completed.

With the use of the crystal growth apparatus 200, it becomes possible to omit the conduit 30 of the crystal growth apparatus 100, and the crystal growth apparatus 200 has a simplified construction.

Further, with the crystal growth apparatus 200, it should be noted that, besides the melt mixture 180 is used for the source material of the GaN crystal, the melt mixture 180 is used further for confining the nitrogen gas and the vapor of the metal Na in the space 213 of the reaction vessel 210, there is no need of providing the metal melt 170 in addition to the melt mixture 180 as in the case of the crystal growth apparatus 100, and it becomes possible to reduce the quantity of metal Na to be used as compared with the crystal growth apparatus 100. As a result, the GaN crystal can be manufactured with low cost.

Further, it is also possible to form the vessel 211 by sintering the powders of boron nitride (BN) or stainless steel (SUS316L, SUS304, or the like).

With Embodiment 2, the vessel 211 of sintered W constitutes "porous member".

Further, the pressure regulator 290 and the gas cylinder 300 constitute "gas supply apparatus".

Further, the space between the reaction vessel 210 and the external reaction vessel 220 constitutes "external space".

Otherwise, the present embodiment is identical to Embodiment 1.

EMBODIMENT 3

Figure 10:
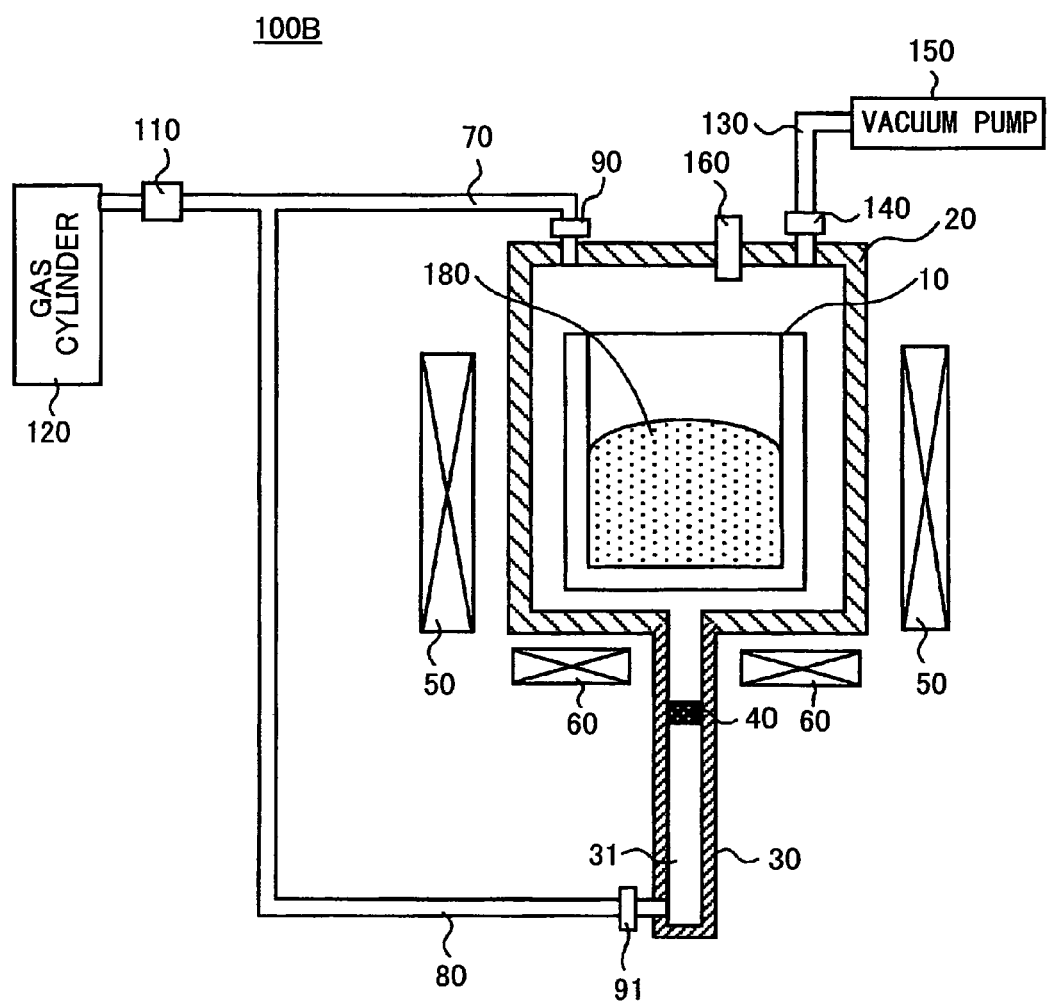
FIG. 10 is a schematic cross-sectional view of a crystal growth apparatus according to Embodiment 3 of the present invention.

FIG. 10 is a schematic cross-sectional diagram of a crystal growth apparatus according to Embodiment 3.

Referring to FIG. 10, the crystal growth apparatus 100B of Embodiment 3 has a construction identical to the crystal growth apparatus 100 of FIG. 1 except that the metal melt 170 is omitted.

Figure 11:
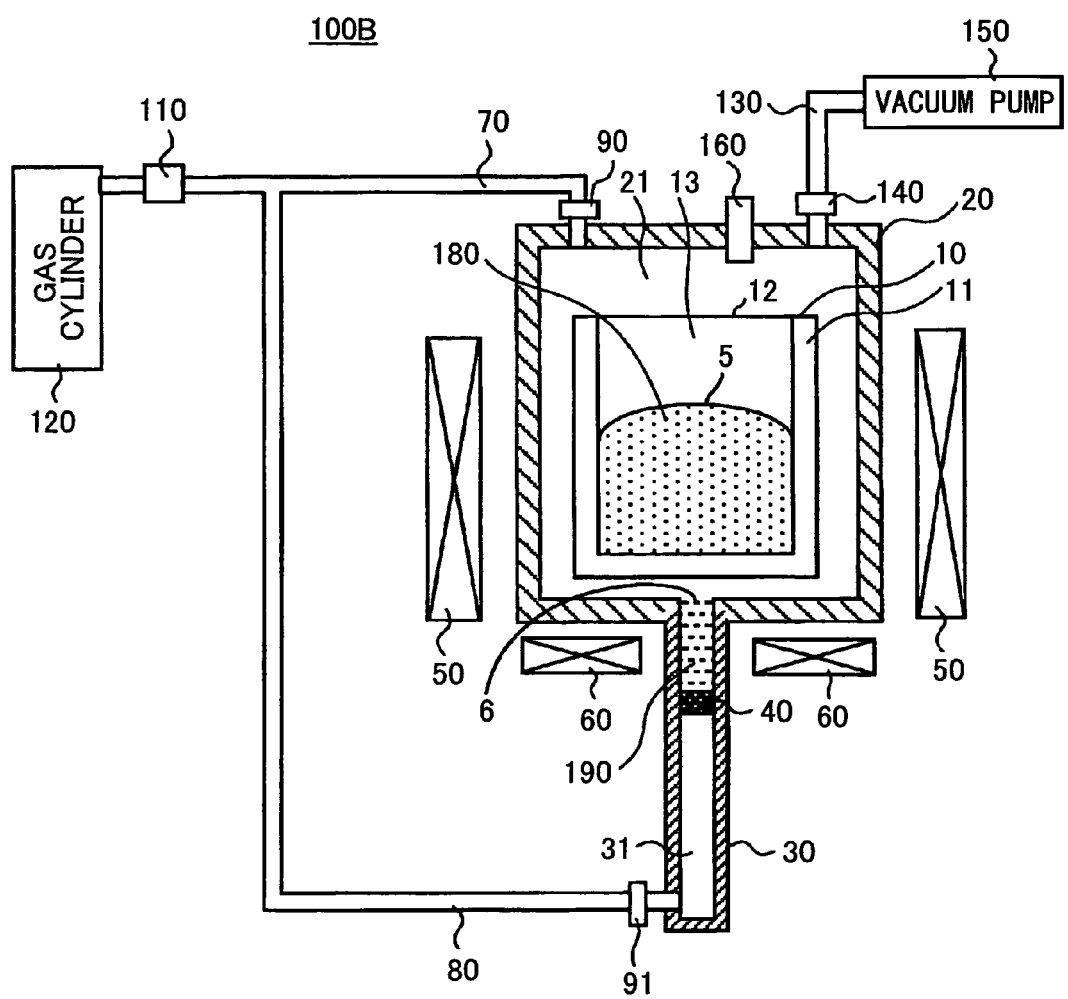
FIG. 11 is a first schematic diagram showing a part of the growth process of the GaN crystal in the crystal growth apparatus shown in FIG. 10.
Figure 12:
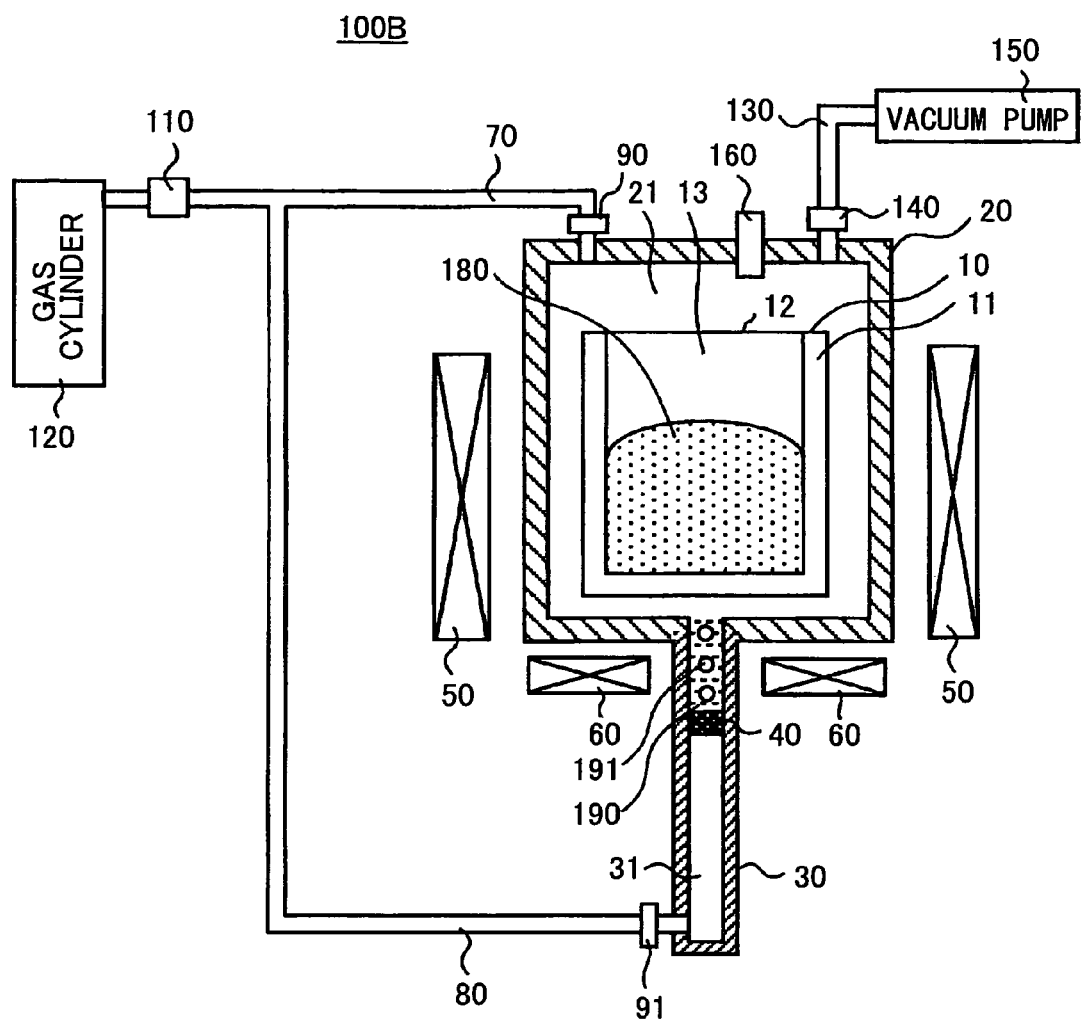
FIG. 12 is a second schematic diagram showing a part of the growth process of the GaN crystal in the crystal growth apparatus shown in FIG. 10.

FIGS. 11 and 12 are respectively first and second schematic diagrams showing a part of the growth process of a GaN crystal conducted with the crystal growth apparatus 100B shown in FIG. 10. There, it should be noted that, in the case of growing a GaN crystal by using the crystal growth apparatus 100B, metal Na and metal Ga are loaded in the reaction vessel 10 while no metal Na is loaded between the reaction vessel 10 and the external reaction vessel 20.

When the reaction vessel 10 and the external reaction vessel 20 are heated to 800° C. by the heating apparatuses 50 and 60 in this state, there is caused evaporation of metal Na from the melt mixture 180, wherein the vapor of the metal Na thus formed cause diffusion from the space 13 into the space 21. Because the temperature of the porous plug 40 is set to 150° C. as noted above, the vapor of the metal Na that has caused diffusion to the space 21 is cooled upon contact with the porous plug 40, wherein the vapor of the metal Na is condensed to form a melt. As a result, there is formed accumulation of a melt 190 of metal Na on the upper side of porous plug 40. Reference should be made to FIG. 11. Thereby, the porous plug 40 holds the melt 190 of metal Na by the surface tension thereof.

Thus, the porous plug 40 and the melt 190 of the metal Na confine the nitrogen gas and the vapor of metal Na into the spaces 13 and 21, and thus, evaporation of the metal Na from the melt mixture 180 is suppressed. As a result, the mole ratio between the metal Na and the metal Ga in the melt mixture 180 is stabilized, and it becomes possible to grow a GaN crystal of large size.

With progress in the growth of the GaN crystal, the nitrogen gas in the space 13 is consumed and the amount of the nitrogen gas in the space 13 is decreased. As a result, the pressure P1 in the spaces 13 and 21 becomes lower than the pressure P2 of the space 31 (P1<P2), and there appears a differential pressure between the spaces 13 and 21 and the space 31. As a result, the nitrogen gas in the space 31 is supplied to the spaces 13 and 21 through the porous plug 40 and further through the melt 190 of the metal Na. In this case, the nitrogen gas passed through the porous plug 40 is transported through the melt 190 of the metal Na in the form of bubbles 191. Reference should be made to FIG. 12.

Thus, it is possible to grow the GaN crystal similarly to the case of the crystal growth apparatus 100 of Embodiment 1, with the present embodiment, without holding the metal Na between the reaction vessel 10 and the external reaction vessel 20 on the initial state.

The manufacturing process of the GaN crystal conducted by using the crystal growth apparatus 100B is conducted similarly to the flowchart of FIG. 2, except that the step S2 thereof is omitted.

With the crystal growth apparatus 100B, it should be noted that the manufacturing of the GaN crystal is achieved by setting the temperature T3 at the gas-liquid interface 6 between the space 21 and the melt 190 of the metal Na or in the vicinity of the gas-liquid interface 6 to be equal to or higher than the temperature T2 at the gas-liquid interface 5 or in the vicinity of the gas-liquid interface 5. The reason of setting the temperature T4 to be equal to or higher than the temperature T2 is identical to the reason of setting the temperature T1 to be equal to or higher than the temperature T2 of Embodiment 1.

Otherwise, Embodiment 3 is identical to Embodiment 1.

EMBODIMENT 4

Figure 13:
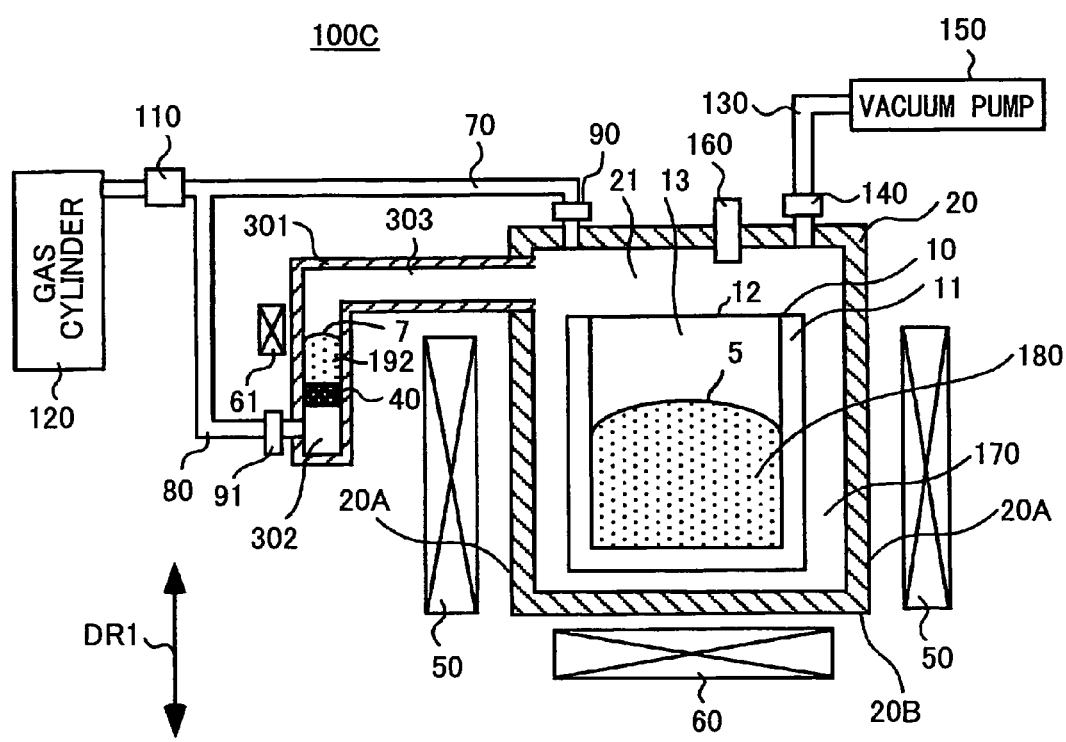
FIG. 13 is a schematic diagram of the crystal growth apparatus according to Embodiment 4.

FIG. 13 is a schematic cross-sectional diagram of a crystal growth apparatus 100C according to Embodiment 4.

Referring to FIG. 13, the crystal growth apparatus 100C of Embodiment 4 uses a conduit 301 in place of the conduit 30 of the crystal growth apparatus 100 of FIG. 1 and a metal melt 192 in place of the metal melt 170 of the crystal growth apparatus 100. Further, a heating apparatus 61 is added. Otherwise, the crystal growth apparatus 100C is identical to the crystal growth apparatus 100.

With the crystal growth apparatus 100C, the porous plug 40 is provided inside the conduit 301 and the gas supply line 80 is connected to a space 302 of the conduit 301.

The conduit 301 has a generally L-shaped form and is connected to the external reaction vessel 20 in the vicinity of the lid part 12 of the reaction vessel 10. Further, the metal melt 192 is formed of a melt of metal Na and is held in the space 303 of the conduit 301 communicating with the space 21 in the external reaction vessel 20 by the porous plug 40.

The heating apparatus 61 is disposed so as to face the conduit 301 and heats a gas-liquid interface 7 between the metal melt 192 and the space 303 to the temperature of 800° C. In this case, the temperature of the porous plug 40 is set to a temperature such as 150° C., at which temperature there is caused no substantial evaporation in the metal melt 192.

In the case of growing a GaN crystal by using the crystal growth apparatus 100C, metal Na and metal Ga are loaded into the reaction vessel 10 in an Ar gas ambient while using a glove box, and metal Na is loaded in the space 303 of the conduit 301 also in the Ar gas ambient. Further, the reaction vessel 10, the external reaction vessel 20 and the conduit 301 are mounted to the crystal growth apparatus 100C in the state in which the space 13 in the reaction vessel 10, the space 21 in the external reaction vessel 20 and the spaces 302 and 303 in the conduit 301 inside are filled with the Ar gas.

Further, vacuum evacuation of the reaction vessel 10, the external reaction vessel 20 and the conduit 301, and filling of nitrogen gas to the reaction vessel 10, the external reaction vessel 20 and the conduit 301, are repeated several times according to the process explained with reference to Embodiment 1.

Thereafter, the reaction vessel 10, the external reaction vessel 20 and the conduit 301 are evacuated to a predetermined pressure by the vacuum pump 150. Further, the valve 140 is closed and the valves 90 and 91 are opened, and a nitrogen gas is filled to the reaction vessel 10, the external reaction vessel 20 and the conduit 301 under control of the pressure regulator 110 so that the pressure inside the reaction vessel 10, the external reaction vessel 20 and the conduit 301 falls in the range of 10-50 atmospheric pressures.

Further, the valve 90 is closed when the pressure detected by the pressure sensors 160 has become 10-50 atmospheric pressure. In this point, the reaction vessel 10, the external reaction vessel 20 and the conduit 301 are at the room temperature, and thus, the metal Na inside the conduit 201 take a solid state. Thus, the nitrogen gas supplied to the space 302 of the conduit 301 causes diffusion to the external reaction vessel 20 and to the reaction vessel 10 through the pores of the porous plug 40, and the pressures in the spaces 13, 21, 302 and 303 are readily set equal.

Upon completion of filling the nitrogen gas to the reaction vessel 10, the external reaction vessel 20 and the conduit 301, the reaction vessel 10 and the external reaction vessel 20 are heated to 800° C. by using the heating apparatuses 50 and 60 and the gas-liquid interface 7 is heated to 800° C. by the heating apparatus 61. Thereafter, the reaction vessel 10, the external reaction vessel 20 and the gas-liquid interface 7 are held at the temperature of 800° C. for the duration of several ten hours to several hundred hours.

Thereby, the metal Na and metal Ga loaded in the reaction vessel 10 undergo melting with the heating process of the reaction vessel 10, and the melt mixture 180 is formed in the reaction vessel 10. Further, the metal Na in the conduit 301 undergoes melting with the heating process of the conduit 301 and the metal melt 192 is formed in the conduit 301. Thereby, because the valves 90 and 140 are closed and the metal melt 192 does not allow a gas to pass therethrough, the nitrogen gas in the reaction vessel 10, the external reaction vessel 20 and the conduit 301 is confined within the spaces 13, 21 and 303.

Further, with progress of growth of the GaN crystal, there is caused evaporation of metal Na from the melt mixture 180 and the metal melt 192, and the vapor of the metal Na and the nitrogen gas are confined in the spaces 13, 21 and 303. In the present case, the pressure of the metal Na vapor in the spaces 13, 21 and 303 takes a value of 0.45 atmospheric pressures.

Further, the nitrogen gas in the space 13 is consumed with the growth of the GaN crystal, and when the pressure P1 inside the reaction vessel 10 has decreased below the pressure P5 of the space 302 in the conduit 301 (P1<P5), the nitrogen gas existing in the space 302 of the conduit 301 is introduced into the spaces 13, 21 and 303 through the porous plug 40 and the metal melt 192.

As a result, high quality, large size and homogeneous GaN crystal is realized similarly to the case of using the crystal growth apparatus 100 shown in FIG. 1.

Manufacture of the GaN crystal by using the crystal growth apparatus 100C is conducted according to a process similar to the flowchart shown in FIG. 2. In this case, the metal Na is loaded in the space 303 of the conduit 301 in the step S2 in the Ar gas ambient. Further, in the step S3, the nitrogen gas is filled to the reaction vessel 10, the external reaction vessel 20 and the conduit 301 at a predetermined pressure (10-50 atmospheric pressures). Further, in the step S4, the reaction vessel 10, the external reaction vessel 20 and the gas-liquid interface 7 are heated to 800° C., and the temperature of the reaction vessel 10, the external reaction vessel 20 and the gas-liquid interface 7 is held at 800° C. in the step S6. Further, the temperature of the reaction vessel 10, the external reaction vessel 20 and the conduit 301 is lowered in the step S7.

Further, with the crystal growth apparatus 100C, manufacture of the GaN crystal is achieved by setting the temperature T6, which is the temperature of the gas-liquid interface 7 between the space 303 and the metal melt 192 or the temperature in the vicinity of the gas-liquid interface 7, to be equal to or higher than the temperature T2, which is the temperature at the gas-liquid interface 5 or the temperature in the vicinity of the gas-liquid interface 5. Here, it should be noted that the reason of setting the temperature T6 to be equal to or higher than the temperature T2 is identical to the reason why the temperature T1 is set to be equal to or higher than the temperature T2 in Embodiment 1.

Further, with the crystal growth apparatus 100C, the heating apparatus 61 may heat the conduit 301 so that the metal Na inside the conduit 301 becomes liquid with the gas-liquid interface 7 having a temperature lower than 800° C.

Further, with the crystal growth apparatus 100C, it is possible to use the porous plug 41 in place of the porous plug 40.

Figure 14:
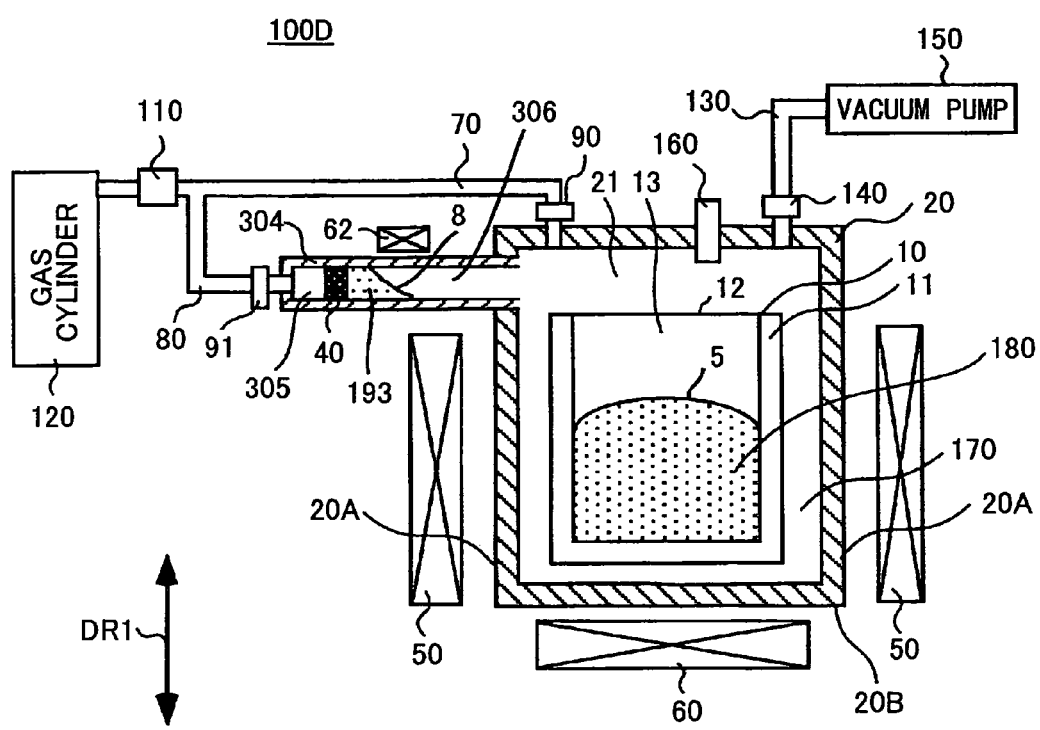
FIG. 14 is another schematic diagram of the crystal growth apparatus of Embodiment 4.

FIG. 14 is another schematic cross-sectional diagram of a crystal growth apparatus according to Embodiment 4 of the present invention. Thus, the crystal growth apparatus of Embodiment 4 may be a crystal growth apparatus 100D shown in FIG. 14.

Referring to FIG. 14, the crystal growth apparatus 100D has a construction in which the conduit 301 of the crystal growth apparatus 100C shown in FIG. 13 is replaced with the conduit 304 and the heating apparatus 61 is replaced with the heating apparatus 62. Otherwise, the crystal growth apparatus 100D is identical to the crystal growth apparatus 100C.

With the crystal growth apparatus 100D, the porous plug 40 is provided inside a conduit 304 and a gas supply line 80 is connected to the space 305 of the conduit 304.

The conduit 304 has a straight form and is connected to the external reaction vessel 20 in the vicinity of the lid part 12 of the reaction vessel 10. Thereby, it should be noted that a metal melt 193 is formed of a melt of metal Na and is held in the space 305 inside the conduit 304 communicating with the space 21 inside external reaction vessel 20 by porous plug 40.

The heating apparatus 62 is disposed so as to face the conduit 304 and heats the gas-liquid interface 8 formed between the metal melt 193 and a space 306 to 800° C. In this case, the temperature of the porous plug 40 is set so that evaporation of the metal melt 193 does not take place substantially.

In the case of growing a GaN crystal by using the crystal growth apparatus 100D, metal Na and metal Ga are loaded in the reaction vessel 10 in an Ar gas ambient while using a glove box, and metal Na is loaded in the space 306 of the conduit 304 also in the Ar gas ambient. Further, the reaction vessel 10, the external reaction vessel 20 and the conduit 304 are mounted upon the crystal growth apparatus 100D in the state that the space 13 of the reaction vessel 10, the space 21 of the external reaction vessel 20 and the spaces 305 and 306 of the conduit 304 are filled with the Ar gas.

Further, vacuum evacuation of the reaction vessel 10, the external reaction vessel 20 and the conduit 304 and filling of the nitrogen gas to the reaction vessel 10, the external reaction vessel 20 and the conduit 304 are repeated several times according to the process explained in Embodiment 1.

Thereafter, the reaction vessel 10, the external reaction vessel 20 and the conduit 304 are evacuated to a predetermined pressure by using the vacuum pump 150, and the valve 140 is closed and the valves 90 and 91 are opened. Thereby, a nitrogen gas is filled to the reaction vessel 10, the external reaction vessel 20 and the conduit 304 while controlling the pressure inside the reaction vessel 10, the external reaction vessel 20 and the conduit 304 to the range of 10-50 atmospheric pressures by using the pressure regulator 110.

The valve 90 is then closed when the pressure detected by the pressure sensor 160 has become 10-50 atmospheric pressures. In this point, the reaction vessel 10, the external reaction vessel 20 and the conduit 304 are at the room temperature, and the metal Na inside the conduit 304 takes a solid state. Thereby, the nitrogen gas supplied to the space 305 of the conduit 304 causes diffusion to the external reaction vessel 20 and further to the reaction vessel 10 through the pores of the porous plug 40, and the pressures in the spaces 13, 21, 305 and 306 are readily set identical.

Upon completion of filling of the nitrogen gas to the reaction vessel 10, the external reaction vessel 20 and the conduit 304, the reaction vessel 10 and the external reaction vessel 20 are heated to 800° C. by using the heating apparatuses 50 and 60, and the gas-liquid interface 8 is heated to 800° C. by using the heating apparatus 62. Thereafter, the temperature of the reaction vessel 10, the external reaction vessel 20 and the gas-liquid interface 8 are held at 800° C. over the period of several ten hours to several hundred hours.

Thereby, it should be noted that the metal Na and metal Ga loaded in the reaction vessel 10 undergo melting with the process of heating the reaction vessel 10, and the melt mixture 180 is formed in the reaction vessel 10. Further, the metal Na inside the conduit 304 undergoes melting with the process of heating the conduit 304 and the metal melt 193 is formed in the conduit 304. Thereby, because the valves 90 and 140 are closed and the metal melt 192 does not allow a gas to pass therethrough, the nitrogen gas in the reaction vessel 10, the external reaction vessel 20 and the conduit 304 is confined within the spaces 13, 21 and 306.

Further, with progress of growth of the GaN crystal, there is caused evaporation of metal Na from the melt mixture 193, and the vapor of the metal Na and the nitrogen gas are confined in the spaces 13, 21 and 306. In the present case, the pressure of the metal Na vapor in the spaces 13, 21 and 306 takes a value of 0.45 atmospheric pressures.

Further, the nitrogen gas in the space 13 is consumed with the growth of the GaN crystal, and when the pressure P1 inside the reaction vessel 10 has decreased below the pressure P6 of the space 305 in the conduit 304 (P1<P6), the nitrogen gas existing in the space 305 of the conduit 304 is introduced into the spaces 13, 21 and 306 through the porous plug 40 and the metal melt 193.

As a result, high quality, large size and homogeneous GaN crystal is realized similarly to the case of using the crystal growth apparatus 100 shown in FIG. 1.

Manufacture of the GaN crystal by using the crystal growth apparatus 100D is conducted according to a process similar to the flowchart shown in FIG. 2. In this case, the metal Na is loaded in the space 306 of the conduit 304 in the step S2 in the Ar gas ambient. Further, in the step S3, the nitrogen gas is filled to the reaction vessel 10, the external reaction vessel 20 and the conduit 304 with a predetermined pressure (10-50 atmospheric pressures). Further, in the step S4, the reaction vessel 10, the external reaction vessel 20 and the gas-liquid interface 8 are heated to 800° C., and the temperature of the reaction vessel 10, the external reaction vessel 20 and the gas-liquid interface 8 is held at 800° C. in the step S6. Further, the temperature of the reaction vessel 10, the external reaction vessel 20 and the conduit 304 is lowered in the step S7.

Further, with the crystal growth apparatus 100D, manufacture of the GaN crystal is achieved by setting the temperature T7, which is the temperature of the gas-liquid interface 8 between the space 306 and the metal melt 193 or the temperature of the region in the vicinity of the gas-liquid interface 8, to be equal to or higher than the temperature T2, which is the temperature at the gas-liquid interface 5 or the temperature in the vicinity of the gas-liquid interface 5. Here, it should be noted that the reason of setting the temperature T7 to be equal to or higher than the temperature T2 is identical to the reason why the temperature T1 is set to be equal to or higher than the temperature T2 in Embodiment 1.

Further, with the crystal growth apparatus 100D, the heating apparatus 62 may heat the conduit 304 so that the metal Na inside the conduit 304 becomes liquid with the gas-liquid interface 8 having a temperature lower than 800° C.

Further, with the crystal growth apparatus 100D, it is possible to use the porous plug 41 in place of the porous plug 40.

Further, with the crystal growth apparatus 100D, it is possible to form a part of the conduit 304 in which the porous plug 40 or 41 is provided to be thinner than the remaining part of the conduit 304 so that the metal melt 193 makes contact with the entire end surface of the porous plug 40 or 41 at the side of the space 306.

Figure 15:
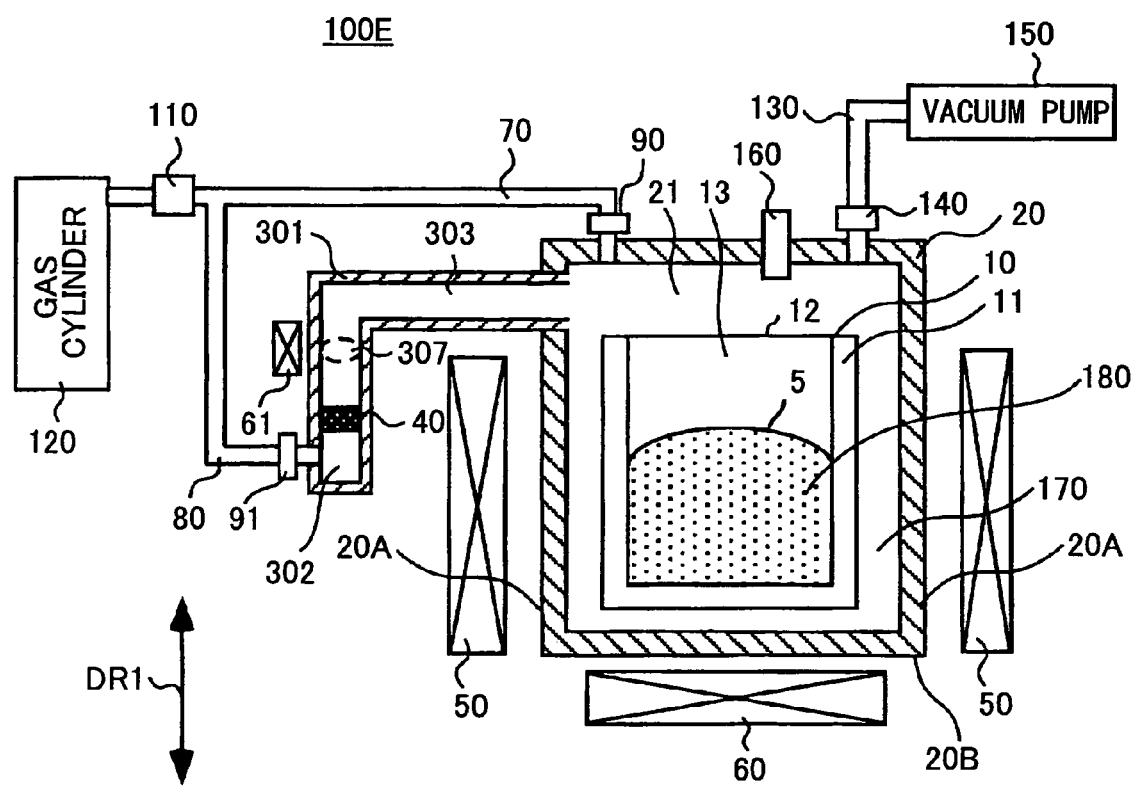
FIG. 15 is a further schematic cross-sectional view of the crystal growth apparatus of Embodiment 4.

FIG. 15 is another schematic cross-sectional diagram of a crystal growth apparatus according to Embodiment 4 of the present invention. Thus, the crystal growth apparatus of Embodiment 4 may be a crystal growth apparatus 100E shown in FIG. 15.

Referring to FIG. 15, the crystal growth apparatus 100E has a construction in which the metal melt 192 is omitted from the crystal growth apparatus 100C of FIG. 13. Otherwise, the crystal growth apparatus 100D is identical to the crystal growth apparatus 100C.

With the crystal growth apparatus 100E, the heating apparatus 61 heats a region 307 of the conduit 301 to 800° C. after the reaction vessel 10 and the external reaction vessel 20 are heated to 800° C. by the heating apparatuses 50 and 60.

Figure 16:
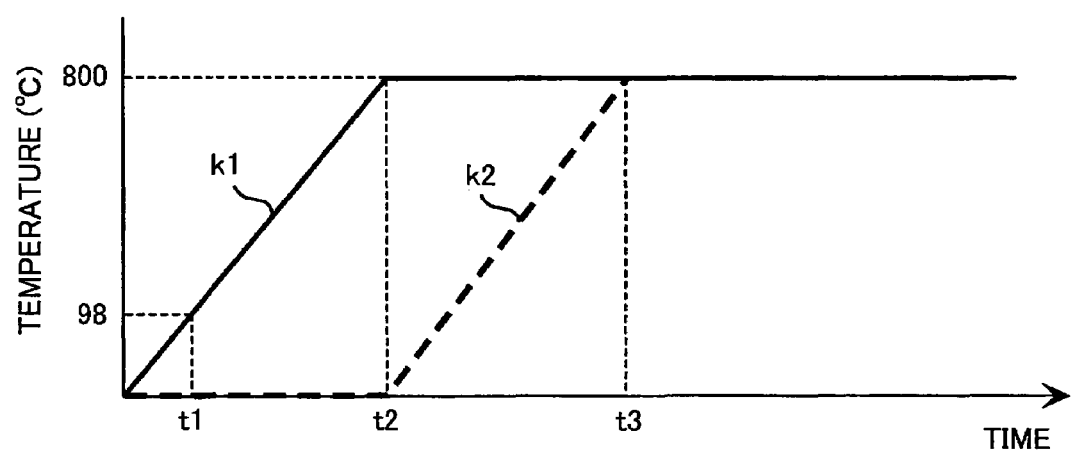
FIG. 16 is a diagram showing a temperature change of a region of the reaction vessel, the external reaction vessel and the lines shown in FIG. 15.

FIG. 16 is a diagram showing a temperature change of the reaction vessel 10, the external reaction vessel 20 and further the region 307 of the conduit 301 shown in FIG. 15. In FIG. 16, a curve k1 represents the temperature change of the reaction vessel 10 and the external reaction vessel 20 and is identical to the temperature change shown in FIG. 3. Further, a curve k2 shows a temperature change of the region 307 of the conduit 301.

Referring to FIG. 16, the heating apparatus 61 starts to heat the region 307 of the conduit 301 at a timing t2 in which the reaction vessel 10 and the external reaction vessel 20 has become 800° C. as a result of heating by the heating apparatuses 50 and 60, wherein the region 307 of the conduit 301 is heated to 800° C. with the timing t3. Further, the heating apparatus 61 holds the region 307 of the conduit 301 to 800° C. after the timing t3 (reference should be made to the curve k2).

When the reaction vessel 10 and the external reaction vessel 20 are heated to 800° C. and the temperature of the melt mixture 180 has become 800° C., there is started the growth of the GaN crystal in the melt mixture 180 after the timing t2 while there starts evaporation of metal Na from the melt mixture 180 at the same time. Thereby, there is caused increases in the vapor of the metal Na vapor in the reaction vessel 10, while the metal Na vapor in the space 13 causes diffusion to the spaces 21 and 303 through the gap existing between the main part 11 and the lid part 12.

In this case, the heating apparatus 61 does not heat the conduit 301, and the temperature of the porous plug 40 is at the room temperature. Thereby, the vapor of the metal Na that has caused diffusion to the space 303 undergoes cooling in the conduit 301 and is accumulated on the porous plug 40 in the form of metal melt or solid body, like the metal melt 192 shown in FIG. 13. the diffusion of the vapor of the metal Na from the space 13 to the space 303 is continued until the vapor of the metal Na reaches an equilibrium state in the spaces 13, 21 and 303. Thus, the diffusion of the metal Na vapor from the space 13 to the space 303 is continued until the temperature T2 of the gas-liquid interface 5 agrees generally to the temperature T6 of the gas-liquid interface 7, in other words, to the timing t3 in which the temperature T6 of the gas-liquid interface 7 agrees to the temperature T2 of the gas-liquid interface 5.

When the vapor of the metal Na in the spaces 13, 21 and 303 has reached the equilibrium state after the timing t3, evaporation of metal Na from the melt mixture 180 is suppressed, and there grows a large GaN crystal grows in the melt mixture 180.

In the case of growing a GaN crystal by using the crystal growth apparatus 100E, metal Na and metal Ga are loaded in the reaction vessel 10 in an Ar gas ambient while using a glove box, and the reaction vessel 10, the external reaction vessel 20 and the conduit 301 are mounted upon the crystal growth apparatus 100E in the state that the space 13 of the reaction vessel 10, the space 21 of the external reaction vessel 20 and the spaces 302 and 303 of the conduit 301 are filled with the Ar gas.

Further, vacuum evacuation of the reaction vessel 10, the external reaction vessel 20 and the conduit 301 and filling of the nitrogen gas to the reaction vessel 10, the external reaction vessel 20 and the conduit 301 are repeated several times according to the process explained in Embodiment 1.

Thereafter, the reaction vessel 10, the external reaction vessel 20 and the conduit 301 are evacuated to a predetermined pressure by using the vacuum pump 150, and the valve 140 is closed and the valves 90 and 91 are opened. Thereby, a nitrogen gas is filled to the reaction vessel 10, the external reaction vessel 20 and the conduit 301 while controlling the pressure inside the reaction vessel 10, the external reaction vessel 20 and the conduit 301 to the range of 10-50 atmospheric pressures by using the pressure regulator 110.

Upon completion of filling of the nitrogen gas to the reaction vessel 10, the external reaction vessel 20 and the conduit 301, the reaction vessel 10 and the external reaction vessel 20 are heated to 800° C. by using the heating apparatuses 50 and 60. When the reaction vessel 10 and the external reaction vessel 20 have reached the temperature of 800° C., the region 307 of the conduit 301 is heated to 800° C. by using the heating apparatus 61, and the temperature of the reaction vessel 10, the external reaction vessel 20 and the region 307 is held thereafter at 800° C. over the period of several ten hours to several hundreds hours.

The metal Na and the metal Ga loaded in the reaction vessel 10 undergo melting with the process of heating the reaction vessel 10 and the melt mixture 180 is formed in the reaction vessel 10 as a result. Thereby, metal Na causes evaporation from the, melt mixture 180 and the vapor of the metal Na causes diffusion to the space 13, the space 21 and further to the space 303.

The vapor of the metal Na thus caused diffusion to the space 303 causes condensation and is accumulated on the porous plug 40 in the form of the metal melt 192. When the temperature of the gas-liquid interface 7 in the conduit 301 has become 800° C. thereafter, the vapor of metal Na reaches an equilibrium state in the spaces 13, 21 and 303, and diffusion of the vapor of metal Na from the space 13 to the space 303 is stopped.

In this state in which the valves 90 and 140 are closed and the metal melt 192 does not allow a gas to pass therethrough, the nitrogen gas inside the reaction vessel 10, the external reaction vessel 20 and the conduit 301 is confined within the spaces 13, 21 and 303.

With progress in the growth of the GaN crystal, there is caused evaporation of metal Na from the melt mixture 180 and the metal melt 192, and the vapor of the metal Na and the nitrogen gas are confined in the spaces 13, 21 and 303. In this case, the vapor pressure of the metal Na in the spaces 13, 21 and 303 takes the value of 0.45 atmospheric pressures. Further, with progress in the growth of the GaN crystal, the nitrogen gas inside the space 13 is consumed, while when the pressure P1 inside the reaction vessel 10 has become lower than the pressure P5 inside the space 303 of the conduit 301 (P1<P5), the nitrogen gas existing in the space 302 of the conduit 301 is introduced into the spaces 13, 21 and 303 through the porous plug 40 and the metal melt 192.

As a result, high quality, large and homogeneous GaN crystal is obtained similarly to the case of using the crystal growth apparatus 100 shown in FIG. 1.

Manufacture of the GaN crystal by using the crystal growth apparatus 100E is conducted according to a process similar to the flowchart shown in FIG. 2, except that the step S2 is omitted. In this case, the nitrogen gas is filled to the reaction vessel 10, the external reaction vessel 20 and the conduit 301 with a predetermined pressure (10-50 atmospheric pressures) in the step S3, and in the step S4, the reaction vessel 10, the external reaction vessel 20 and the gas-liquid interface 7 are heated to 800° C. Further, in the step S6, the temperature of the reaction vessel 10, the external reaction vessel 20 and the gas-liquid interface 7 is held at 800° C. and the temperature of the reaction vessel 10, the external reaction vessel 20 and the conduit 301 is lowered in the step S7.

Otherwise, it is identical to the crystal growth apparatus 100C.

Figure 17:
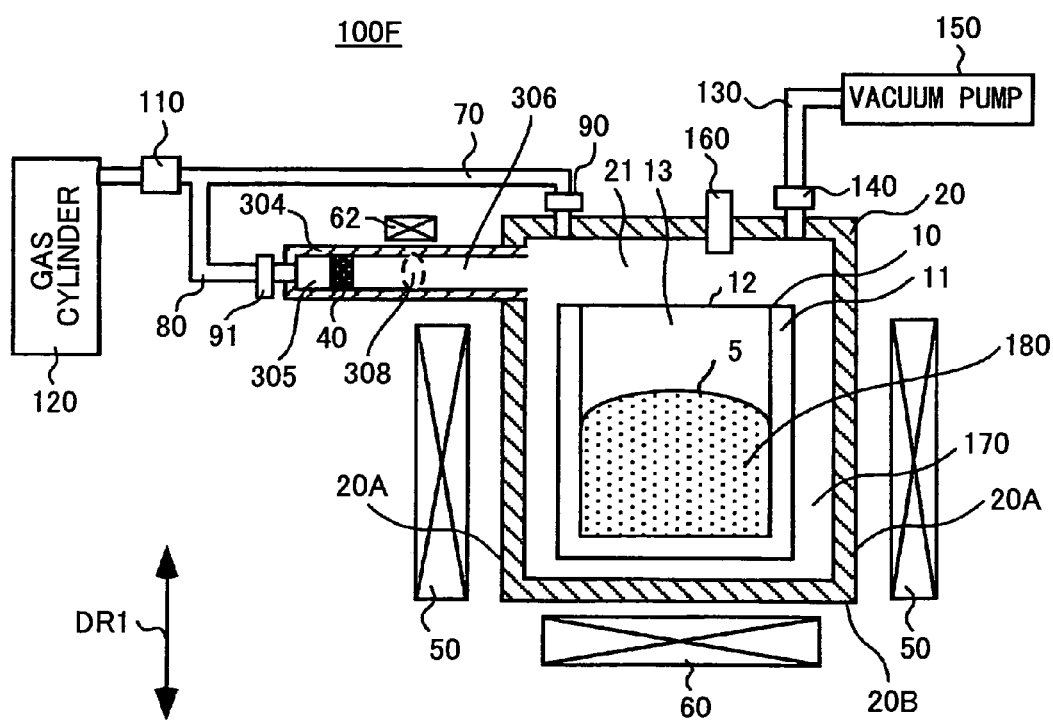
FIG. 17 is a further schematic cross-sectional view showing the crystal growth apparatus according to Embodiment 4.

FIG. 17 is a further schematic cross-sectional diagram of the crystal growth apparatus according to Embodiment 4 of the present invention, wherein the crystal growth apparatus of Embodiment 4 may be a crystal growth apparatus 100F shown in FIG. 17.

Referring to FIG. 17, the crystal growth apparatus 100F is identical to the crystal growth apparatus 100D shown in FIG. 14 except that the metal melt 193 is omitted.

With the crystal growth apparatus 100F, the heating apparatus 62 heats a region 308 inside the conduit 304 to 800° C. after the reaction vessel 10 and the external reaction vessel 20 are heated to 800° C. by the heating apparatuses 50 and 60. In this case, the heating apparatus 62 heats the region 308 to 800° C. in accordance with a curve k2 shown in FIG. 16.

In the case of growing a GaN crystal by using the crystal growth apparatus 100F, metal Na and metal Ga are loaded in the reaction vessel 10 in an. Ar gas ambient while using a glove box, and the reaction vessel 10, the external reaction vessel 20 and the conduit 304 are mounted upon the crystal growth apparatus 100F in the state that the space 13 of the reaction vessel 10, the space 21 of the external reaction vessel 20 and the spaces 305 and 306 of the conduit 304 are filled with the Ar gas.

Further, vacuum evacuation of the reaction vessel 10, the external reaction vessel 20 and the conduit 304 and filling of the nitrogen gas to the reaction vessel 10, the external reaction vessel 20 and the conduit 304 are repeated several times according to the process explained in Embodiment 1.

Thereafter, the reaction vessel 10, the external reaction vessel 20 and the conduit 304 are evacuated to a predetermined pressure by using the vacuum pump 150, and the valve 140 is closed and the valves 90 and 91 are opened. Thereby, a nitrogen gas is filled to the reaction vessel 10, the external reaction vessel 20 and the conduit 304 while controlling the pressure inside the reaction vessel 10, the external reaction vessel 20 and the conduit 304 to the range of 10-50 atmospheric pressures by using the pressure regulator 110.

Upon completion of filling of the nitrogen gas to the reaction vessel 10, the external reaction vessel 20 and the conduit 304, the reaction vessel 10 and the external reaction vessel 20 are heated to 800° C. by using the heating apparatuses 50 and 60. When the reaction vessel 10 and the external reaction vessel 20 are heated to 800° C., a region 308 of the conduit 304 is heated to 800° C. by the heating apparatus 62, and the reaction vessel 10, the external reaction vessel 20 and the region 308 are held at 800° C. over the period of several ten hours to several hundred hours.

Thereby, it should be noted that the metal Na and metal Ga loaded in the reaction vessel 10 undergo melting with the process of heating the reaction vessel 10, and the melt mixture 180 is formed in the reaction vessel 10. Further, there occurs evaporation of the metal Na from the melt mixture 180 and the vapor of the metal Na causes diffusion to the space 13, the space 21 and the space 306.

The vapor of the metal Na thus caused diffusion to the space 306 is accumulated on the porous plug 40 in the form of the metal melt 193 as explained before. When the temperature of the gas-liquid interface 8 in the conduit 304 has become 800° C. thereafter, the vapor of metal Na reaches an equilibrium state in the spaces 13, 21 and 306, and diffusion of the vapor of metal Na from the space 13 to the space 306 is stopped.

Thereby, because the valves 90 and 140 are closed and the metal mel 193 does not allow a gas to pass therethrough, the nitrogen gas in the reaction vessel 10, the external reaction vessel 20 and the conduit 304 is confined within the spaces 13, 21 and 306.

Further, with progress of growth of the GaN crystal, there is caused evaporation of metal Na from the melt mixture 193, and the vapor of the metal Na and the nitrogen gas are confined in the spaces 13, 21 and 306. In the present case, the pressure of the metal Na vapor in the spaces 13, 21 and 306 takes a value of 0.45 atmospheric pressures.

Further, the nitrogen gas in the space 13 is consumed with the growth of the GaN crystal, and when the pressure P1 inside the reaction vessel 10 has decreased below the pressure P6 of the space 305 in the conduit 304 (P1<P6), the nitrogen gas existing in the space 305 of the conduit 304 is introduced into the spaces 13, 21 and 306 through the porous plug 40 and the metal melt 193.

As a result, high quality, large size and homogeneous GaN crystal is realized similarly to the case of using the crystal growth apparatus 100 shown in FIG. 1.

Manufacture of the GaN crystal by using the crystal growth apparatus 100F is conducted according to a process similar to the flowchart shown in FIG. 2, except that the step S2 is omitted. In this case, the nitrogen gas is filled to the reaction vessel 10, the external reaction vessel 20 and the conduit 304 with a predetermined pressure (10-50 atmospheric pressures) in the step S3, and in the step S4, the reaction vessel 10, the external reaction vessel 20 and the gas-liquid interface 8 are heated to 800° C. Further, in the step S6, the temperature of the reaction vessel 10, the external reaction vessel 20 and the gas-liquid interface 8 is held at 800° C. and the temperature of the reaction vessel 10, the external reaction vessel 20 and the conduit 304 is lowered in the step S7.

Otherwise, it is identical to the crystal growth apparatus 100C.

While it has been explained in the embodiments from Embodiment 1 through Embodiment 4 that the crystal growth temperature is 800° C., the present invention is not limited to such a specific temperature, and thus, it is sufficient to set the crystal growth temperature to 600° C. or higher. Further, with regard to the nitrogen gas pressure, it is sufficient that the nitrogen gas has several atmospheric pressures needed for conducting the crystal growth processes of the present invention. This means that the upper limit pressure is not limited to 50 atmospheric pressures as explained with the embodiments of the present invention, and it is also possible to use a pressure exceeding 50 atmospheric pressures.

Further, while the foregoing embodiments have been explained for the case of loading the metal Na and metal Ga in the reaction vessel 10 or 210 in the Ar gas ambient and loading metal Na to the reaction vessel 10 or 210 and to the external reaction vessel 20 or 220 in the Ar gas ambient, the present invention is not limited to such specific examples, and it is also possible to load the metal Na and the metal Ga to the reaction vessel 10 or 210 in a gas ambient other than the Ar gas ambient, such as the gas ambient of He, Ne, Kr, or the like, or in a nitrogen gas ambient. Further, it is possible to load the metal Na between the reaction vessel 10 or 210 and the external reaction vessel 20 or 220, or to the conduit 301 or 304 in the gas ambient other Ar or in the nitrogen gas ambient. Generally, the metal Na and the metal Ga are loaded in the reaction vessel 10 or 210 in the inert gas or nitrogen gas ambient, and the metal Na is loaded between the reaction vessel 10 or 210 and the external reaction vessel 20 or 220, or to the conduit 301 or 304 in the inert gas or nitrogen gas ambient. In this case, the inert gas or the nitrogen gas should not contain water exceeding the amount of 10 ppm and oxygen exceeding the amount of 10 ppm.

Further, the nitrogen gas supplied to the reaction vessel 10 through the porous plug 40 or 41 during the crystal growth of the GaN crystal should not contain water and oxygen exceeding the amount of 10 ppm.

Further, while the explanation has been made for the case the metal mixed with the metal Ga is Na, the present invention is not limited to such a specific case, and it is possible to form the melt mixture 180 by mixing an alkali metal such as lithium (Li), potassium (K), and the like, or an alkaline earth metal such as magnesium (Mg), calcium (Ca), strontium (Sr), and the like, with the metal Ga. Upon melting, the alkali metal forms an alkali metal melt, while the alkaline earth metal forms an alkaline earth metal melt.

Furthermore, it is possible to manufacture the GaN crystal by using a compound containing nitrogen as a constituent element such as sodium azide, ammonia, and the like, in place of the nitrogen gas. In this case, these compounds also constitute the nitrogen source gas.

Furthermore, it is possible to replace Ga with a group III metal such as boron (B), aluminum (Al), indium (In), and the like.

Thus, the crystal growth apparatus or manufacturing process of the present invention includes manufacturing of a group III nitride crystal by using a melt mixture of an alkali metal or alkaline earth metal and a group III metal (including boron) in general.

The group III nitride crystal manufactured by using the crystal growth apparatus or the manufacturing process of the present invention may be used for fabrication of group III nitride semiconductor devices including light emitting diode, laser diode, photodiode and transistor.

The present invention is applicable to a crystal growth apparatus that grows and crystallizes a group III nitride crystal while suppressing evaporation of the alkali metal to the outside of the system. Further, the present invention is applied to manufacturing process that manufactures a group III nitride crystal while suppressing evaporation of the alkali metal to the outside of the system.

Further, the present invention is by no means limited to the embodiments described heretofore, but various variations and modifications may be made without departing from the scope of the invention.

The present invention is based on Japanese priority application No. 2005-231762 filed on Aug. 10, 2005, the entire contents of which are incorporated herein as reference.

What is claimed is:

1. A method of manufacturing a group III metal nitride crystal using a crystal growth apparatus, said crystal growth apparatus comprising:
   a reaction vessel holding a melt mixture containing an alkali metal and a group III metal in a vessel space thereof; and
   a porous member provided in a path through which a vapor of said alkali metal in contact with said metal mixture in said vessel space escapes to an external space, said porous member holding a metal melt by a surface tension thereof, said porous member further supplying through said reaction vessel a nitrogen source gas fed from outside said reaction vessel by a pressure difference formed between said vessel space in said reaction vessel and said external space, said method comprising:
   (i) loading said alkali metal and said group III metal in said reaction vessel in an ambient of an inert gas or a nitrogen gas;
   (ii) filling said vessel space with said nitrogen source gas;
   (iii) heating said reaction vessel to a crystal growth temperature;
   (iv) holding said reaction vessel at said crystal growth temperature for a predetermined interval; and
   (v) supplying said nitrogen source gas to said reaction vessel through said porous member so that a pressure of said vessel space is maintained at a predetermined pressure.

2. The method as claimed in claim 1, wherein said metal melt is identical to said melt mixture.

3. The method as claimed in claim 1, wherein said crystal growth apparatus further comprises an external reaction vessel surrounding said reaction vessel, said metal melt being disposed between said reaction vessel and said external reaction vessel, said method further comprising:
   (vi) loading a metal of said metal melt in a part between said reaction vessel and said external reaction vessel in an ambient of an inert gas or a nitrogen gas; and
   (vii) heating said part between said reaction vessel and said external reaction vessel to a temperature where said metal for metal melt undergoes melting.

4. The method as claimed in claim 3, wherein said method further comprises: (viii) holding said porous member to a temperature that precludes evaporation of said metal melt through said porous member.

5. The method as claimed in claim 3, wherein said metal melt is different from said melt mixture.

6. The method as claimed in claim 5, wherein said metal melt is a melt of an alkali metal.

7. The method as claimed in claim 1, wherein said crystal growth apparatus further comprises an external reaction vessel surrounding said reaction vessel, said metal melt in between said reaction vessel and said external reaction vessel, and wherein said method further comprises: following (v), holding said porous member to a temperature that precludes said metal melt from evaporating through said porous member.

8. A crystal growth apparatus comprising:
  a reaction vessel holding a melt mixture that comprises an alkali metal and a group III metal in a vessel space thereof;
  a porous member holding a metal melt by a surface tension thereof in a path through which a vapor of said alkali metal in contact with said metal mixture in said vessel space escapes to an external space, said porous member further supplying through said reaction vessel and said metal melt a nitrogen source gas fed from outside said reaction vessel by a pressure difference formed between said vessel space and said external space; and
  a heating apparatus heating said melt mixture to a crystal growth temperature.

9. The crystal growth apparatus as claimed in claim 8, wherein said metal melt is different from said melt mixture.

10. The crystal growth apparatus as claimed in claim 9, wherein said metal melt comprises a melt of an alkali metal.

11. The crystal growth apparatus as claimed in claim 9, further comprising an external reaction vessel surrounding said reaction vessel, and wherein said porous member holds said metal melt between said external reaction vessel and said reaction vessel.

12. The crystal growth apparatus as claimed in claim 11, wherein said porous member has a temperature set to preclude evaporation of said metal melt.

13. The crystal growth apparatus as claimed in claim 12, further comprising a conduit connected to said external reaction vessel at a bottom part of said reaction vessel, wherein said porous member is inside said conduit at a location lower to a connection between said external reaction vessel and said conduit.

14. The crystal growth apparatus as claimed in claim 12, further comprising a gas supplying unit supplying that supplies said nitrogen source gas to said porous member from said external space.

15. The crystal growth apparatus as claimed in claim 12, wherein a first temperature at a first interface between said metal melt and a space inside defined by said external reaction vessel and said vessel space, or in the vicinity of said first interface1 is equal to or higher than a second temperature at a second interface between said vessel space and said melt mixture, or in the vicinity of said second interface.

16. The crystal growth apparatus as claimed in claim 15, wherein said first temperature is coincident to said second temperature.

17. The crystal growth apparatus as claimed in claim 8, wherein said metal melt is identical to said melt mixture.

18. The crystal growth apparatus as claimed in claim 17, wherein said porous member is in contact with said melt mixture.

19. The crystal growth apparatus as claimed in claim 18, wherein said reaction vessel comprises a first vessel of said porous member holding therein said melt mixture, and a second vessel in contact with said first vessel, said second vessel prohibiting passage of said melt mixture and a gas.

20. The crystal growth apparatus as claimed in claim 19, further comprising an external vessel surrounding said reaction vessel and a gas supplying unit that supplies said nitrogen source gas to a part between said reaction vessel and said external reaction vessel so that a pressure between said reaction vessel and said external reaction vessel generally coincides with a pressure of said vessel space.

21. The crystal growth apparatus as claimed in claim 8, wherein said porous member comprises a sintered body of metal or ceramic.

22. The crystal growth apparatus as claimed in claim 8, wherein said porous member comprises a metal wire.

* * * * *